United States Patent
Boufounos et al.

(10) Patent No.: US 10,455,250 B2
(45) Date of Patent: Oct. 22, 2019

(54) METHOD AND SYSTEM FOR DISTRIBUTED CODING OF IMAGES

(71) Applicant: Mitsubishi Electric Research Laboratories, Inc., Cambridge, MA (US)

(72) Inventors: Petros Boufounos, Winchester, MA (US); Maxim Goukhshtein, Toronto (CA); Toshiaki Koike-Akino, Malden, MA (US); Stark C Draper, Toronto (CA)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 164 days.

(21) Appl. No.: 15/608,000

(22) Filed: May 30, 2017

(65) Prior Publication Data

US 2018/0352249 A1    Dec. 6, 2018

(51) Int. Cl.
*H04N 19/593*     (2014.01)
*H04N 19/149*     (2014.01)
(Continued)

(52) U.S. Cl.
CPC ........... *H04N 19/593* (2014.11); *G06F 17/18* (2013.01); *G06K 9/00* (2013.01); *H03M 13/25* (2013.01);
(Continued)

(58) Field of Classification Search
None
See application file for complete search history.

(56) References Cited

U.S. PATENT DOCUMENTS

| | | | |
|---|---|---|---|
| 6,784,812 B2* | 8/2004 | Craven | H03M 7/3046 341/50 |
| 7,275,036 B2* | 9/2007 | Geiger | G10L 19/022 704/200.1 |

(Continued)

OTHER PUBLICATIONS

Goukhshtein Maxim et al., "Distributed Coding of Multispectral Images," 2017 IEEE International Symposium on Information Theory, IEEE, Jun. 25, 2017. pp. 3230-3234.

*Primary Examiner* — Reza Aghevli
(74) *Attorney, Agent, or Firm* — Gennadiy Vinokur; James McAleenan; Hironori Tsukamoto

(57) ABSTRACT

A method for reconstructing an uncompressed signal. The method includes obtaining an encoded signal corresponding to the signal. Obtaining side information about the signal and using the side information to obtain a prediction of dithered linear measurements of the signal. Using the prediction of the dithered linear measurements and encoded quantized dithered linear measurements to obtain quantized linear measurements of the signal based on processing each bitplane iteratively, starting from a least significant level bitplane to a most significant level bitplane. At each iteration, a prediction of each bitplane is formed using the prediction of the dithered linear measurements and the bitplanes processed in the previous iterations. Wherein each code for each bitplane is used to correct each bitplane prediction. Reconstructing the signal as a reconstructed signal using the recovered quantized dithered linear measurements, wherein the steps are performed in a processor of a decoder.

34 Claims, 15 Drawing Sheets

(51) Int. Cl.
  *H04N 19/103* (2014.01)
  *H04N 19/184* (2014.01)
  *H04N 19/192* (2014.01)
  *H04N 19/44* (2014.01)
  *G06F 17/18* (2006.01)
  *H03M 13/25* (2006.01)
  *G06K 9/00* (2006.01)
  *H04N 19/39* (2014.01)
  *H04N 19/30* (2014.01)

(52) U.S. Cl.
  CPC ......... *H04N 19/103* (2014.11); *H04N 19/149* (2014.11); *H04N 19/184* (2014.11); *H04N 19/192* (2014.11); *H04N 19/395* (2014.11); *H04N 19/44* (2014.11); *G06K 2009/00644* (2013.01)

(56) References Cited

U.S. PATENT DOCUMENTS

| | | | |
|---|---|---|---|
| 7,860,158 B2* | 12/2010 | Vetro | H04N 19/597 375/240 |
| 8,428,379 B2* | 4/2013 | Rane | H04N 19/647 382/232 |
| 8,947,274 B2* | 2/2015 | Shibata | H03M 7/3059 341/107 |
| 9,014,499 B2* | 4/2015 | Rane | H04N 19/61 375/240.03 |
| 9,307,257 B2* | 4/2016 | Rane | H04N 19/46 |
| 9,501,717 B1* | 11/2016 | Boufounos | G06T 1/0007 |
| 2007/0223823 A1* | 9/2007 | Islam | H04N 19/132 382/232 |
| 2011/0170591 A1* | 7/2011 | Li | H04N 19/105 375/240.01 |
| 2012/0140829 A1 | 6/2012 | Rane et al. | |

* cited by examiner

Encoder

Decoder

METHOD AND SYSTEM FOR DISTRIBUTED CODING OF IMAGES

FIELD

The present disclosure relates generally to signal processing, and more particularly to coding uncompressed signals, wherein the coding includes a low-complexity encoding approach for compression of images, that shifts the complexity to the decoding.

BACKGROUND

Lossy compression is widely used in signal processing and signal transmission. There are several applications of lossy signal compression, such as the compression of camera images, multispectral images, hyperspectral images, and synthetic aperture radar (SAR) data, to name a few. In such applications, the goal is to encode the signal with an encoder and use a small number of bits to represent the signal, such that the signal can be transmitted at a lower bit rate, at the expense of some distortion in the signal, i.e., there is some loss of information during the compression, hence the compressions is lossy.

For example, conventional coding methods include the conventional encoder taking as input an uncompressed signal and producing a compressed signal. Lossless transmission can be used to transmit the compressed signal to the conventional decoder, which produces a decompressed signal, which is an estimate of the uncompressed signal. The goal of the conventional encoder performing the compression, is to produce a bitstream, i.e., a sequence of bits that represent the signal with as little distortion as possible for a given bit-rate.

The conventional decoder, decompressing the signal, uses the sequence of bits produced by the conventional encoder to recover the original signal with as little distortion as possible for the given bit rate.

A number of commonly used state of the art encoding methods use two techniques: prediction followed by transformation. The prediction, when used, tries to predict parts of the signal being encoded, e.g., blocks of an image, using information from other parts of the signal, or from other signals or their parts. Therefore, a conventional encoder may include prediction parameters in the bitstream describing how the prediction was performed, e.g., which part of the signal was used and which prediction method was used, so that a conventional decoder can also perform the same prediction step.

Because the prediction is typically imperfect, there is a prediction residual that is also encoded. The conventional hope is that the residual is easy to encode, so that the rate used to transmit the prediction parameters and the rate used to code the residual is lower than simply encoding the signal without prediction. Some encoders, omit the prediction and simply encode the signal without prediction, typically achieving a lower compression performance.

Those two conventional techniques are typically combined with other techniques that refine the performance of the conventional encoder, e.g., by selecting how many bits of the bitstream to use for each part of the signal so that the trade off between rate and distortion is optimally traded throughout the signal. Entropy-coding of the significant transformation coefficients and their location may also be used.

Unfortunately, those encoding techniques produce very complex conventional encoders, and, typically require very simple conventional decoders. This is because, in some applications, the conventional encoder can have significant computational resources, while the conventional decoder at the playback device can have limited resources. But, in applications in which the encoder has to be limited computationally, this approach becomes problematic. For example, such environments include airborne and spaceborne platforms, such as remote sensing systems on satellites, which require large amounts of raw data that need to be compressed and transmitted. In such platforms, conventional compression approaches based on transform coding, such as JPEG and JPEG2000, are not a viable option, since they require large amounts of computational resources along with consuming significant amounts of power.

An alternative to those conventional techniques is known in the art as distributed coding, and is sometimes referred to as Slepian-Wolf coding if it is lossless, or Wyner-Zyv if it is lossy, as more often the case in images. These distributed coding approaches exhibit a lightweight encoder, shifting some of the computational complexity to the decoder.

Unfortunately, these approaches have several drawbacks in practice. In particular, it is not well known in the art how such approaches can easily exploit the structure of the signal, as is done in transformation-based methods, without also adding significant complexity to the encoder. Furthermore, typical distributed coding approaches are not able to accurately estimate the bit rate required to compress the image. Thus, practical approaches either are conservative and overestimate that rate—reducing the compression efficiency—or require feedback from the decoder to know when to stop sending bits—making them impractical in a number of applications, such as satellite imaging and remote sensing.

For this reason, and other reasons, there is a need to develop methods, systems and devices having a low-complexity encoding approach for efficient compression of images, including multispectral images, that shifts the complexity to the decoding while exploiting the structure of images.

SUMMARY

The present disclosure relates generally to methods, systems and devices for signal processing, and more particularly to coding uncompressed signals, wherein the coding includes a low-complexity encoding approach for compression of images, that shifts the complexity to the decoding.

Specifically, the present disclosure recognizes that the acquisition and compression of images, such as multispectral images and like images, are of great importance in an environment where resources such as computational power and memory are scarce. For example, computational resources available for satellite image compression, radar signal compression and the like, are very limited due to restrictions on the processors and their power, such that they can withstand space travel conditions and conform to a limited power budget. Furthermore, some applications, such as hyperspectral or multispectral image compression, use a certain amount of data for prediction and transformation. This, in turn, requires memory storage, which is a problem due to the limitations of conventional portable devices. For many of such applications, the computational resources and power available to the conventional decoder are essentially unlimited. Hence, we validated through experimentation, that we could decrease the complexity of the encoder, at the expensense of making more complex decoders to overcome these technological problems where computational power and memory are scarce.

The present disclosure is based on a recognition that the encoder can be designed to compressively measure blocks of a signal or image of interest and use syndrome coding to encode the bitplanes of measurements of said image. We use a lightweight distributed coding approach that exploits structural correlations among bands. Specifically, we assume that a signal is available as side information at the decoder, along with statistical information that provide for coarse prediction of the signal or image of interest, or its measurements. Wherein, the decoder, upon receiving the encoded signal, can access the side information, that can be used to predict the bitplanes and to decode them. The side information is also used to guide the reconstruction of the signal or image of interest from the decoded measurements. In other words, the present disclosure provides for a novel low-complexity encoding approach for compression of signals or images, that shifts the complexity to the decoding. We combine principles from compressed sensing and distributed source coding, to provide for an accurate control of a prediction error and a compression rate.

For example, the encoder obtains a signal from a sensor, wherein a processor in communication with the sensor obtains measurements of the signal. The encoder then encodes the measurements of the signal as encoded quantized dithered linear measurements, wherein the encoded quantized dithered linear measurements of the signal correspond to quantized dithered linear measurements of the signal. In particular, the quantized dithered linear measurements are separated into bitplanes, and each bitplane is encoded with a code at a predetermined rate that ensures a reliable correction of a prediction of the quantized dithered linear measurements of the signal. Finally, the encoder transmits via transmitter to a decoder the encoded signal corresponding to the signal.

To better understand the present disclosure, we can explain the process another way, in that we uniquely and efficiently combine quantized compressed sensing (CS) and randomized sampling techniques with distributed coding, to provide for an accurate control of the prediction error and the compression rate. In addition, we exploit structural correlations between bands, both in decoding, i.e. by forming an accurate prediction from the side information, and in the CS-based reconstruction, i.e. by influencing the weights in the optimization. Thus, we can utilize more complex structural models of the image, beyond second order statistics, such as with sparsity and structured sparsity.

In particular, encoding first linearly measures the signal using a randomized measurement matrix. Then, the measurements may be dithered, quantized and separated into bitplanes from the least to the most significant. Given that side information is available at the decoder, each bitplane is separately compressed by computing and transmitting a syndrome at the appropriate rate. The decoder can then decode each bitplane iteratively, starting from the least significant and iterating to the most significant. At each iteration, a prediction of the bitplane is formed using the signal prediction and the bitplanes decoded in the previous iterations. The syndromes are used to correct the bitplane prediction, to recover the quantized measurements. In turn, these are used to reconstruct the signal using a sparse optimization informed by the side information.

Another embodiment of the invention is a method for reconstructing a signal, wherein the signal is uncompressed. The method includes obtaining an encoded signal corresponding to the signal, wherein the encoded signal includes encoded quantized dithered linear measurements of the signal, such that the encoded quantized dithered linear measurements of the signal correspond to quantized dithered linear measurements of the signal. The quantized dithered linear measurements are separated into bitplanes, and each bitplane is encoded with a code at a predetermined rate that ensures a reliable correction of a prediction of the quantized dithered linear measurements of the signal. The method obtains side information about the signal, and then uses the side information to obtain a prediction of the linear measurements of the signal. The method then uses the prediction of the linear measurements of the signal and the encoded quantized dithered linear measurements to obtain the quantized linear measurements of the signal, based on processing each bitplane iteratively. Decoding starts iteratively from a least significant level bitplane to a most significant level bitplane. At each iteration, a prediction of each bitplane is formed using the measurement prediction and the bitplanes processed and decoded in the previous iterations. Each code for each bitplane is used to correct each bitplane prediction, so as to recover recover all the bitplanes, and, therefore, the quantized dithered linear measurements. Then, the signal is reconstructed as a reconstructed signal using the recovered quantized dithered linear measurements, wherein the steps are performed in a decoder.

Another embodiment of the disclosure comprises a non-transitory computer readable storage medium embodied thereon a program executable by a computer for performing a method. The method is for reconstructing a signal, wherein the signal is uncompressed. The method includes obtaining an encoded signal corresponding to the signal, such that the encoded signal includes encoded quantized dithered linear measurements of the signal, wherein the encoded quantized dithered linear measurements of the signal correspond to quantized dithered linear measurements of the signal, such that the quantized dithered linear measurements are separated into bitplanes, and each bitplane is encoded with a code at a predetermined rate that ensures a reliable correction of a prediction of the quantized dithered linear measurements of the signal. The method obtains side information about the signal, and then uses the side information to obtain a prediction of the linear measurements of the signal. Further, the method uses a prediction of the linear measurements of the signal and the encoded quantized dithered linear measurements to obtain the quantized linear measurements of the signal based on processing each bitplane iteratively. Each bitplane is decoded iteratively from a least significant level bitplane to a most significant level bitplane, such that at each iteration, a prediction of each bitplane is formed using the measurements prediction and the bitplanes processed in the previous iterations. Wherein each code for each bitplane is used to correct each bitplane prediction, so as to recover the quantized dithered linear measurements. Finally, reconstructing the signal as a reconstructed signal using the recovered quantized dithered linear measurements, wherein the steps are performed in a decoder.

According to an embodiment of the present disclosure, the encoder receives a signal from a sensor, wherein a processor in communication with the sensor obtains measurements of the signal. The encoder then encodes the measurements of the signal as encoded quantized dithered linear measurements, wherein the encoded quantized dithered linear measurements of the signal correspond to quantized dithered linear measurements of the signal. In particular, the quantized dithered linear measurements are separated into bitplanes, and each bitplane is encoded with a code at a predetermined rate that ensures a reliable correction of a prediction of the quantized dithered linear measurements of the signal. Finally, transmits via transmitter to a decoder, the encoded signal corresponding to the signal.

Further features and advantages of the present disclosure will become more readily apparent from the following detailed description when taken in conjunction with the accompanying drawings.

BRIEF DESCRIPTION OF THE DRAWINGS

The present disclosure is further described in the detailed description which follows, in reference to the noted plurality of drawings by way of non-limiting examples of exemplary embodiments of the present disclosure, in which like reference numerals represent similar parts throughout the several views of the drawings. The drawings shown are not necessarily to scale, with emphasis instead generally being placed upon illustrating the principles of the presently disclosed embodiments.

Figure 1A:
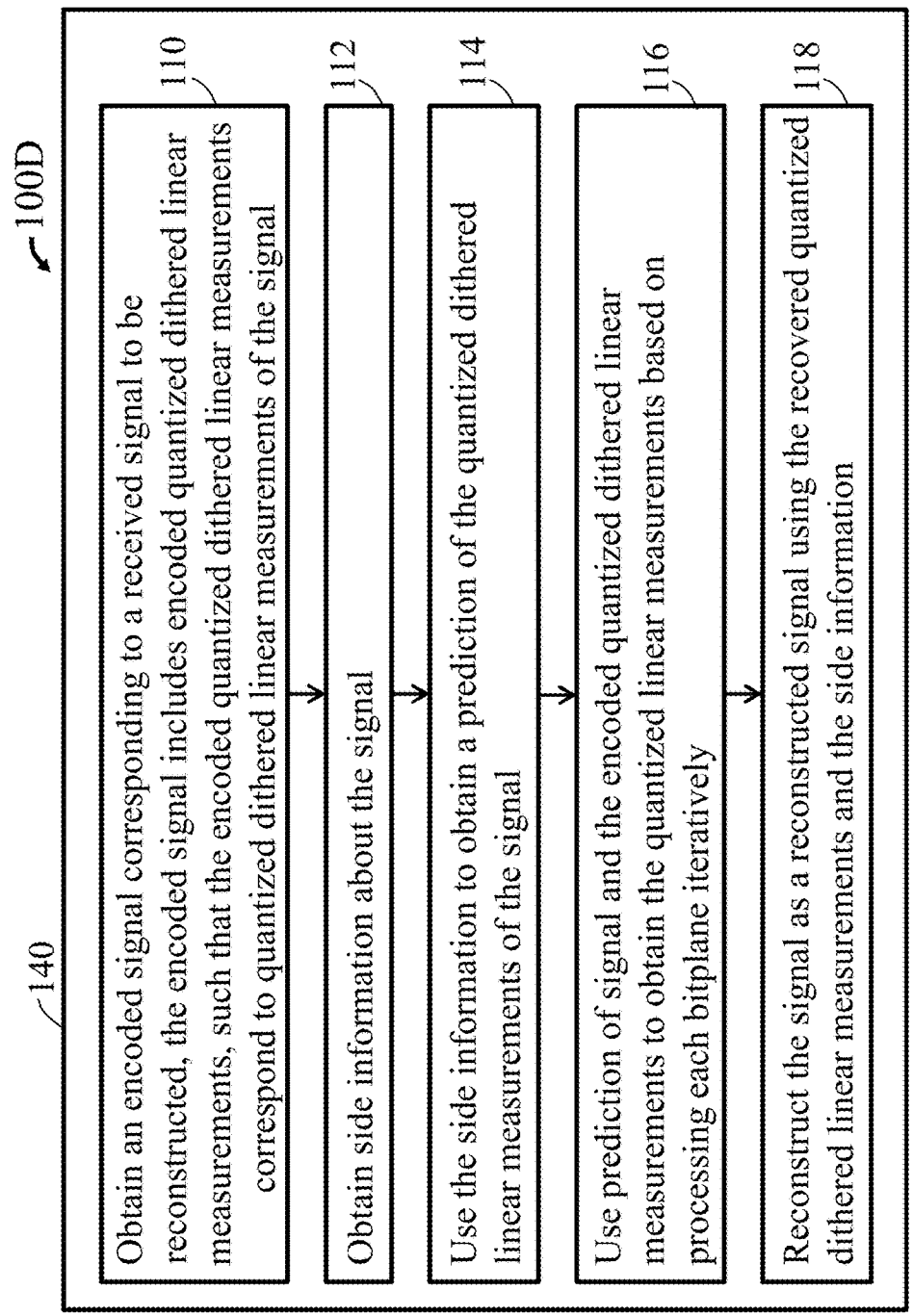
FIG. 1A shows a block diagram of methods for reconstructing a signal, wherein the signal is uncompressed, in accordance with one embodiment of the present disclosure.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Overview

The present disclosure relates to methods, systems and devices for signal processing, and in particular to coding uncompressed signals, wherein the coding includes a low-complexity encoding approach for compression of images, that shifts the complexity to the decoding.

The present disclosure recognizes that the acquisition and compression of images, such as multispectral images, are important in an environment where resources such as computational power and memory are limited. For example, computational resources available for satellite image compression, radar signal compression and the like, are very limited due to restrictions on the processors such that they can withstand space travel conditions and conform to a limited power budget. Hence, we validated through experimentation, that we could decrease the complexity of the encoder, at the expensense of making more complex decoders to overcome these technological problems where computational power and memory are scarce.

The present disclosure is based on a recognition that the encoder can be designed to compressively measure blocks of a signal or image of interest and use syndrome coding to encode the bitplanes of measurements of said image. We use a lightweight distributed coding approach that exploits structural correlations among bands. Specifically, we assume that a signal is available as side information at the decoder, along with statistical information that provide for coarse prediction of the signal or image of interest, or its measurements. Wherein, the decoder, upon receiving the encoded signal, can access the side information, that can be used to predict the bitplanes and to decode them. The side information is also used to guide the reconstruction of the signal or image of interest from the decoded measurements. In other words, the present disclosure provides for a novel low-complexity encoding approach for compression of signals or images, that shifts the complexity to the decoding. We combine principles from compressed sensing and distributed source coding, to provide for an accurate control of a prediction error and a compression rate.

For example, the encoder obtains a signal from a sensor, wherein a processor in communication with the sensor obtains measurements of the signal. The encoder then encodes the measurements of the signal as encoded quantized dithered linear measurements, wherein the encoded quantized dithered linear measurements of the signal correspond to quantized dithered linear measurements of the signal. In particular, the quantized dithered linear measurements are separated into bitplanes, and each bitplane is encoded with a code at a predetermined rate that ensures a reliable correction of a prediction of the quantized dithered linear measurements of the signal. Finally, the encoder transmits via transmitter to a decoder the encoded signal corresponding to the signal.

In other words, we can efficiently combine quantized compressed sensing (CS) and randomized sampling techniques with distributed coding, to provide for an accurate control of the prediction error and the compression rate. In addition, we exploit structural correlations between signals or images, both in decoding, i.e. by forming an accurate prediction from the side information, and in the CS-based reconstruction, i.e. by influencing the weights in the optimization. Thus, we can utilize more complex structural models of the signal or the image, beyond second order statistics, such as with sparsity and structured sparsity. However, to better comprehend the compressed sensing and quantization, we first need to provide a brief overview for each of them.

Compressed Sensing and Quantization

A structure that can be exploited is sparsity in some domain, such as a basis transform or in the signal derivative. To ensure information is preserved, incoherent linear measurements of the signal can be obtained, typically randomized, of the form y=Ax, where y is the measurements vector, x is the signal of interest, and A is the measurement matrix.

The signal can be recovered by solving a sparse inverse problem. One of the most useful sparsity-promoting metrics in imaging can be the total variation norm, which quantifies the sparsity of the image gradient. Additional prior information about the image can be incorporated by adjusting the weights of a weighted total variation (WTV) norm. The isotropic two-dimensional (2D) WTV is defined as $$WTV(X) = \sum_{s,t} \sqrt{W^x_{s,t}(X_{s,t} - X_{s-1,t})^2 + W^y_{s,t}(X_{s,t} - X_{s,t-1})^2}, \quad (1)$$

where X is a 2D image, $W^x$ and $W^y$ are 2D sets of weights, and (s, t) are image coordinates. Larger weights penalize edges more in the respective location and direction, while smaller weights reduce their significance. We use X and x interchangeably to refer to the same signal. The former denotes the signal arranged as an N×N 2D image, while the latter as a column vector of length n=N×N.

At least one approach is to reconstruct the image to solve the following regularized convex optimization:

$$\hat{x} = \operatorname*{argmin}_x \|y - Ax\|_2^2 + \lambda WTV(x), \quad (2)$$

where $\lambda$ is an appropriately chosen regularization parameter. There are several heuristics to set the weights in WTV(·). This approach of switching between a large and a small weight, depending on the prior information, can be effective.

Alternative approaches may solve different regularized convex optimization problems, wherein the regularizes promotes the sparsity of the signal in some basis or redundant dictionary. This regularizer might also be weighted using a set of weights. One approach is to solve the following regularized convex optimization $$\hat{x} = \operatorname*{argmin}_x \|y - Ax\|_2^2 + \lambda \|WB^{-1}x\|_1 \quad (3)$$

where B is some appropriate basis for describing the signal. This is equivalent to solving, $$\hat{x} = B\left(\operatorname*{argmin}_\alpha \|y - AB\alpha\|_2^2 + \lambda \|W\alpha\|_1\right) \quad (3)$$

where $\alpha$ is the vector of basis coefficients that represent the signal.

Other alternative approaches may use a greedy algorithm, such as the well-known Compressive Sensing Matching Pursuit (CoSaMP) or Iterative Hard thresholding (IHT).

It should be noted that, despite the reduced number of measurements, when quantization and bit rate are taken into account, quantized CS does not produce as good a compression as transform coding. To improve performance, the present disclosure's approach combines CS with distributed coding, thus, enabling more efficient use of the available bitrate.

Distributed Source Coding

Distributed source coding, a source coding approach that exploits side information available at the decoder to reduce the rate required for reliable transmission. Wherein, the encoder can optimally encode the signal without requiring access to the side information.

Regarding aspects of the present disclosure, a sequence of bits $q \in F_2^m$ should be encoded and transmitted, knowing that the decoder has access to a prediction $\hat{q}=q+e$ of the same sequence. In the prediction, each predicted bit may be incorrect with some probability p, i.e., the typical error vector e has Hamming weight pm. To encode q, the encoder computes a syndrome using a linear code s=Hq, where $H \in F_2^{M \times m}$ can be a parity check matrix.

Given $\hat{q}$ and s, the decoder finds the error vector e* with the minimum Hamming weight such that $s=H(\hat{q}+e^*)$ and estimates q as q as $\bar{q}=\hat{q}+e^*$. Successful decoding implies that $\bar{q}=q$, i.e., all the errors have been corrected. The probability of an error in decoding can be made arbitrarily small as m increases, as long as the code used to generate the syndrome has rate $r<C(p)=1-H_B(p)$, where $H_B(p)=-p \log_2(p)-(1-p) \log_2(1-p)$ is the binary entropy for probability p and $C(\cdot)$ is the capacity of the corresponding binary symmetric channel. Equivalently, the syndrome needs to have length $M>m(1-C(p))=mH_B(p)$. Of course, for finite blocklengths a slightly lower rate is necessary to guarantee reliable decoding.

Embodiments of the present disclosure may uses a capacity approaching class of codes based on low-density parity-check (LDPC). Wherein, the LDPC parity check matrix H is sparse, making it efficient to store on-board a satellite. At least one aspect is that this provides for computationally efficient decoding based on belief propagation. To design the parity check matrix of irregular LDPC codes, some embodiments of this invention may use the Pareto optimization approach, where the highest coding gain and lowest decoding complexity can be achieved at the same time by analyzing the extrinsic information transfer (EXIT) trajectory across decoding iterations. We may consider check-concentrated triple-variable-degree LDPC codes for designing the degree distribution, while the girth can be maximized in a greedy fashion by means of progressive-edge-growth (PEG). Other embodiments may use different design strategies, or, even, different codes, such as turbo codes, polar codes, fountain codes, convolutional codes, or others, as known in the art.

As noted above, we combine quantized compressed sensing (CS) and randomized sampling techniques with distributed coding, to provide for an accurate control of the prediction error and the compression rate. Along with exploiting the structural correlations between signals or images, both in decoding, i.e. by forming an accurate prediction from the side information, and in the CS-based reconstruction, i.e. by influencing the weights in the optimization. Specifically, encoding first linearly measures the signal using a randomized measurement matrix and, optionally, adds dither. The measurements can be quantized and separated into bitplanes from the least to the most significant. Given that side information is available at the decoder, each bitplane is separately compressed by computing and transmitting a syndrome at the appropriate rate.

The appropriate rate of the syndrome can be determined as function of the predictive quality of the side information or the corresponding prediction. In some embodiments, the predictive quality is measured using the prediction error. The encoder can use an estimate of the predictive quality to determine the appropriate rate. The decoder has the same estimate available, and, therefore, can determine the rate of the syndromes it expects to receive. In general, the appropriate rate is higher for the least significant bitplanes, and reduces as the bitplane significance increases. In some embodiments the appropriate rate might be zero for the most significant bitplanes.

In some embodiments, if the appropriate rate of the syndrome for a certain bitplane is close to zero, the encoder might not send a syndrome. The implied assumption used in these embodiments is that the prediction at the decoder is of sufficient quality and does not need to be further corrected.

In some embodiments, if the appropriate rate of the syndrome is similar to the length of the bitplane, the encoder might send the bitplane as is, instead of a syndrome. The determination in these embodiments is that the complexity of computing a syndrome at the encoder, as well as the complexity of computing a prediction of the bitplane and correcting it at the decoder, is not worth the small rate savings of transmitting a syndrome instead of the bitplane itself.

In some embodiments, the appropriate rate is selected from a list of pre-determined rates, for which the necessary parity check matrices used to compute the syndrome have been pre-calculated. If the appropriate rate is not available in the pre-determined list, the system might select a higher rate from the list, since this rate will still guarantee reliable decoding. Thus, the average transmission rate will be slightly higher than if the optimal appropriate rate was used. At the expense of using slightly higher rate, this allows for lower complexity in the encoder, since a finite number of parity check matrices needs to be stored in the encoder memory, and there is no need to calculate he parity check matrices during the operation of the system. Alternative embodiments might calculate the parity check matrices during the operation of the system.

The decoder can then decode each bitplane iteratively, starting from the least significant and iterating to the most significant. At each iteration, a prediction of the bitplane is formed using the signal prediction and the bitplanes decoded in the previous iterations. The syndromes are used to correct the bitplane prediction, to recover the quantized measurements. In turn, these are used to reconstruct the signal using a sparse optimization informed by the side information. Further, we discovered through experimentation the present disclosure exhibits lower complexity, while delivering up to 6 dB improvement in peak signal-to-noise ratio (PSNR) over a similar conventional encoding rate.

In some embodiments the whole bitplane might be received for some of the least significant bitplanes, as described above. In those embodiments, the bitplane is used to completely replace the predicted bitplane, instead of correcting it.

In some embodiments, no syndrome might be received for some of the most significant bitplanes. In those cases, the bitplane prediction is presumed correct by the decoder and does not need to be corrected.

FIG. 1A shows a block diagram of methods for reconstructing a signal, wherein the signal is uncompressed, in accordance with one embodiment of the present disclosure.

Method 100D includes a processor 140 that processes step 110 of obtaining an encoded signal corresponding to the signal, wherein the encoded signal includes encoded quantized dithered linear measurements of the signal, such that the encoded quantized dithered linear measurements of the signal correspond to quantized dithered linear measurements of the signal. The quantized dithered linear measurements are separated into bitplanes, and each bitplane is encoded with a code at a predetermined rate that ensures a reliable correction of a prediction of the quantized dithered linear measurements of the signal.

Step 112 of FIG. 1A, includes obtaining side information about the signal.

Step 114 of FIG. 1A, uses the side information to obtain a prediction of the quantized dithered linear measurements of the signal.

Step 116 of FIG. 1A, uses the prediction of the dithered linear measurements of the signal and the encoded quantized dithered linear measurements to obtain the quantized linear measurements of the signal, based on processing each bitplane iteratively. Bitplane decoding iteratives from a least significant level bitplane to a most significant level bitplane, such that at each iteration, a prediction of each bitplane is formed using the prediction of the dithered linear measurements of the signal and the bitplanes processed in the previous iterations. In each iteration, each code for each bitplane is used to correct each bitplane prediction, so as to recover the quantized dithered linear measurements.

Step 118 of FIG. 1A, includes reconstructing the signal as a reconstructed signal using the recovered quantized dithered linear measurements and the side information, wherein the steps are performed in a decoder.

Figure 1B:
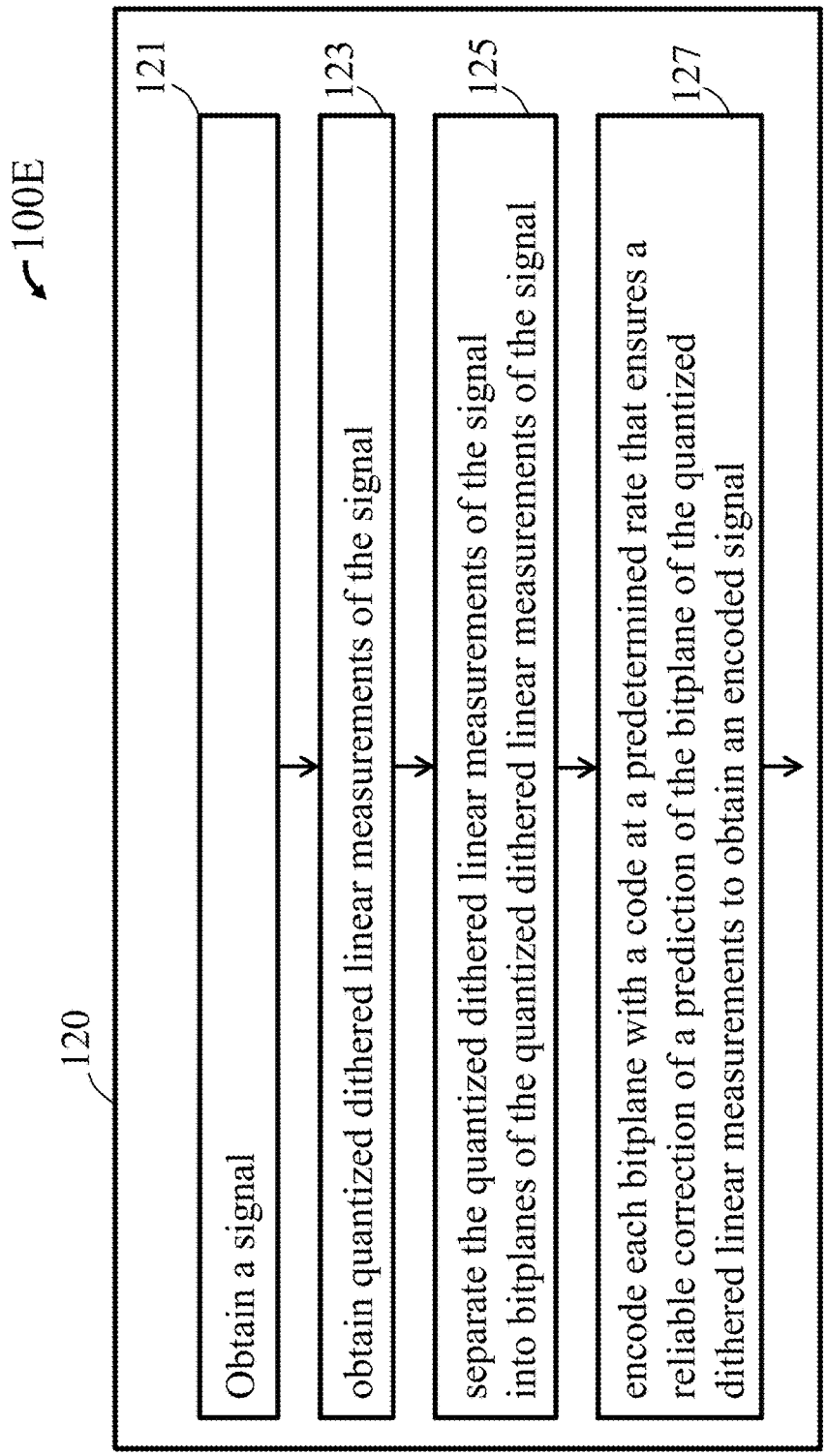
FIG. 1B shows a block diagram of methods for encoding a signal, wherein the signal is uncompressed, in accordance with one embodiment of the present disclosure.

Referring to FIG. 1B, FIG. 1B shows a block diagram of methods for obtaining an encoded signal, wherein the signal is uncompressed. Method 100E includes a processor 120 that processes step 121 of obtaining a signal, such as but not limited to a multispectral image, a hyperspectral image, synthetic aperture radar (SAR) data, or other radar data.

Step 123 of FIG. 1B, includes obtaining quantized dithered linear measurements of the signal.

Step 125 of FIG. 1B, includes separating the quantized dithered linear measurements of the signal into bitplanes of the quantized dithered linear measurements of the signal.

Step 123 of FIG. 1B, includes encoding each bitplane of the quantized dithered linear measurements of the signal with a code, at a predetermined rate that ensures a reliable correction of a prediction of the bitplane of the quantized dithered linear measurements, to obtain an encoded signal.

Figure 1C:
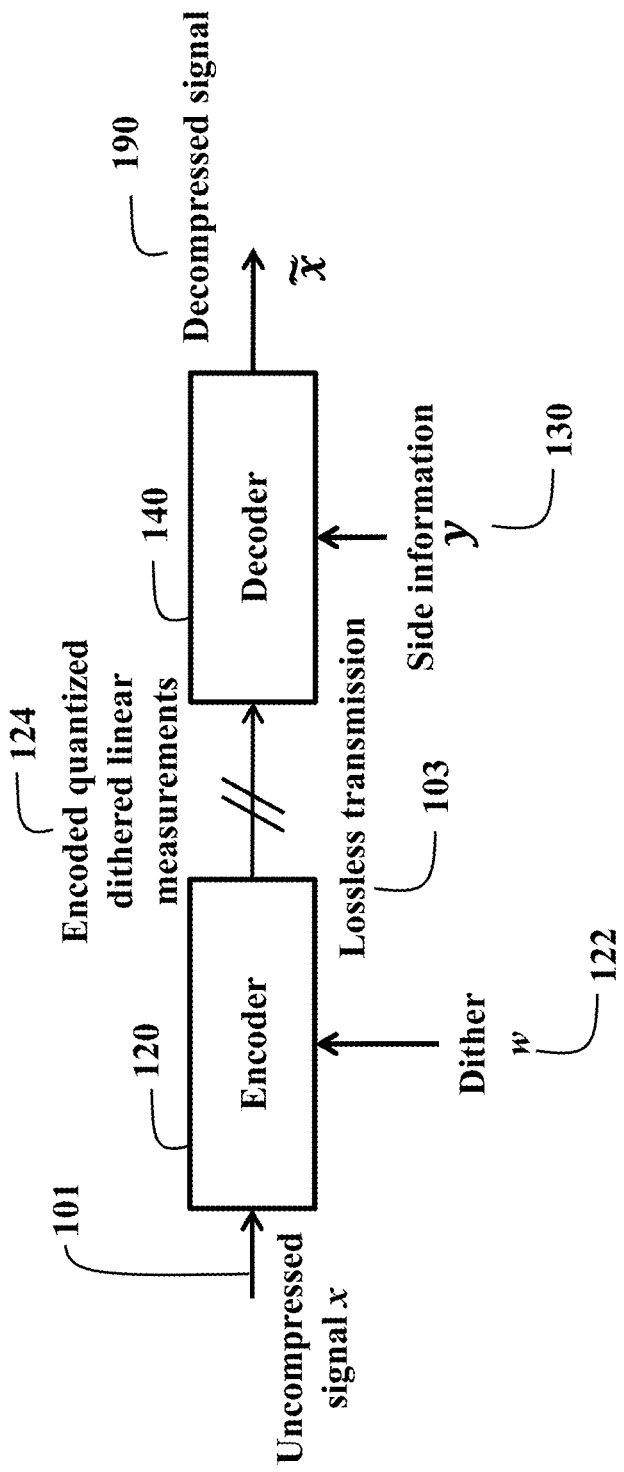
FIG. 1C is a high level block diagram of the compression method of FIG. 1B and FIG. 1A, according to embodiments of the present disclosure.

FIG. 1C is a high level block diagram of an embodiment of the compression method of FIG. 1B and FIG. 1A, according to embodiments of the present disclosure. For example, FIG. 1C shows an encoder 120 that takes an uncompressed signal 101 as input to produce encoded quantized dithered linear measurements 124, which can be transmitted losslessly 103 to a decoder 140. The decoder 140 decodes the encoded quantized dithered linear measurements using side information y 130 to produce a decompressed signal 190.

Encoder

Still referring to FIG. 1C, the role of the encoder 120 is to encode the signal x 101 to a bitstream that is the encoded quantized dithered linear measurements 120 which correspond to the compressed signal and will be used by the decoder to produce the decompressed signal 190, which is an estimate of the signal x. The encoder 120 assumes that the decoder 140 is able to use the side information y 130 form a prediction of x, denoted $\hat{x}$, which can include some distortion.

To encode the uncompressed x, the encoder 120 obtains linear measurements of x, to which dither w 122 is added, and then quantized to produce quantized dithered linear measurements q. The quantized dithered linear measurements are encoded according to the embodiments of this invention to produce the compressed signal to be transmitted losslessly to the decoder.

Decoder

Still referring to FIG. 1C, the decoder 140 uses the side information 130 to obtain a prediction of the quantized linear measurements of x. In some embodiments, the prediction is formed by first forming $\hat{x}$, which is an estimate of x, obtaining linear measurements of $\hat{x}$, adding the dither w 122, thus producing a prediction of linear measurements of x. The encoded quantized linear measurements of x contain syndromes that are combined by the decoder with the prediction of linear measurements of x to iterate between predicting bitplanes of the quantized dithered linear measurements q and correcting the prediction, as described above and below. Once all the bitplanes are correct, the resulting quantized dithered linear measurements are used, together with the prediction $\hat{x}$ of x, and any other prior knowledge about x, to reconstruct the decompressed signal $\tilde{x}$, which is an estimate of x with significantly less distortion than $\hat{x}$.

Figure 1D:
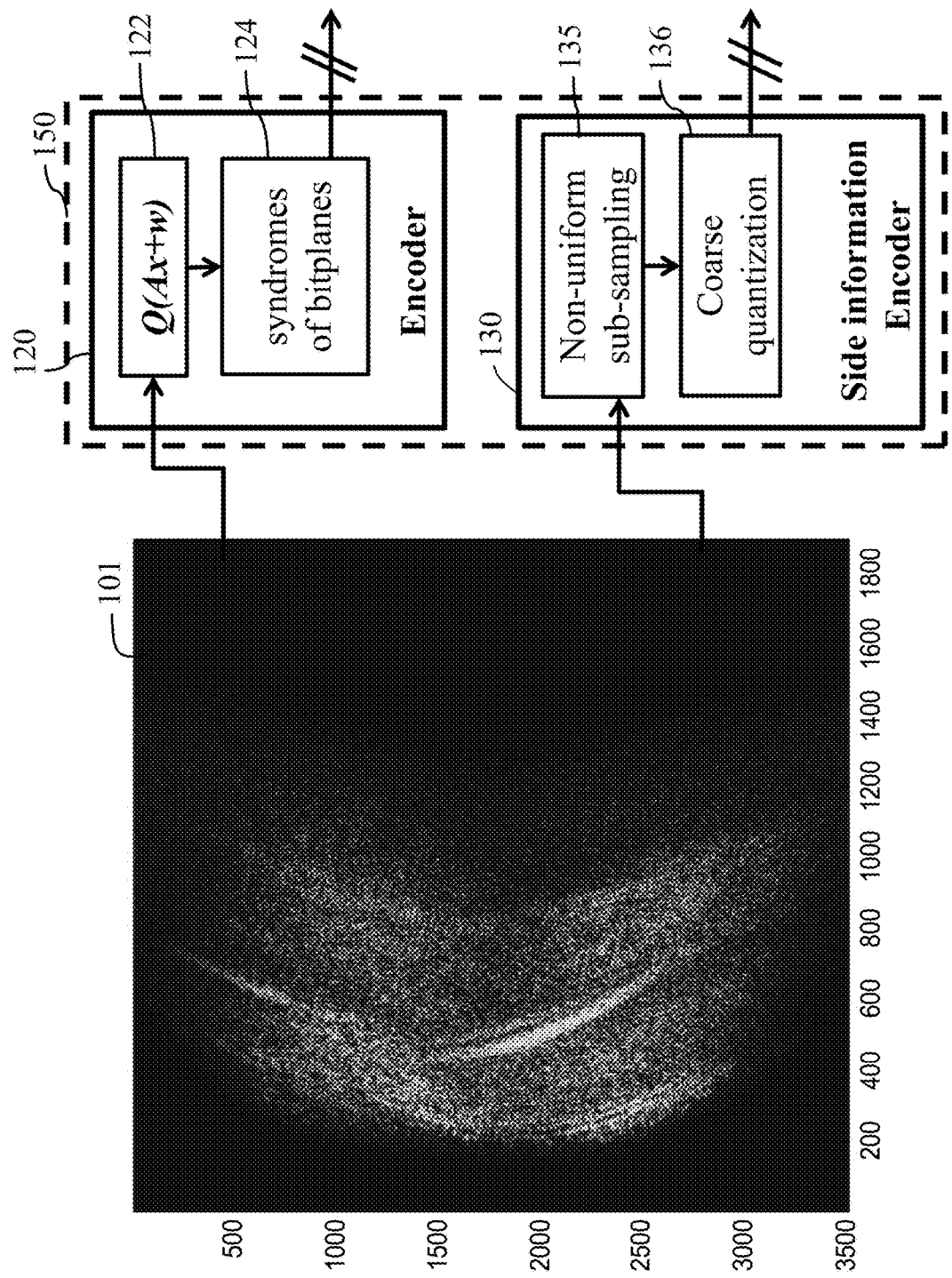
FIG. 1D and FIG. 1E are flow diagrams of compressing a multispectral or hyperspectral image using the method of FIG. 1B and FIG. 1A, respectively, according to embodiments of the present disclosure.
Figure 1E:
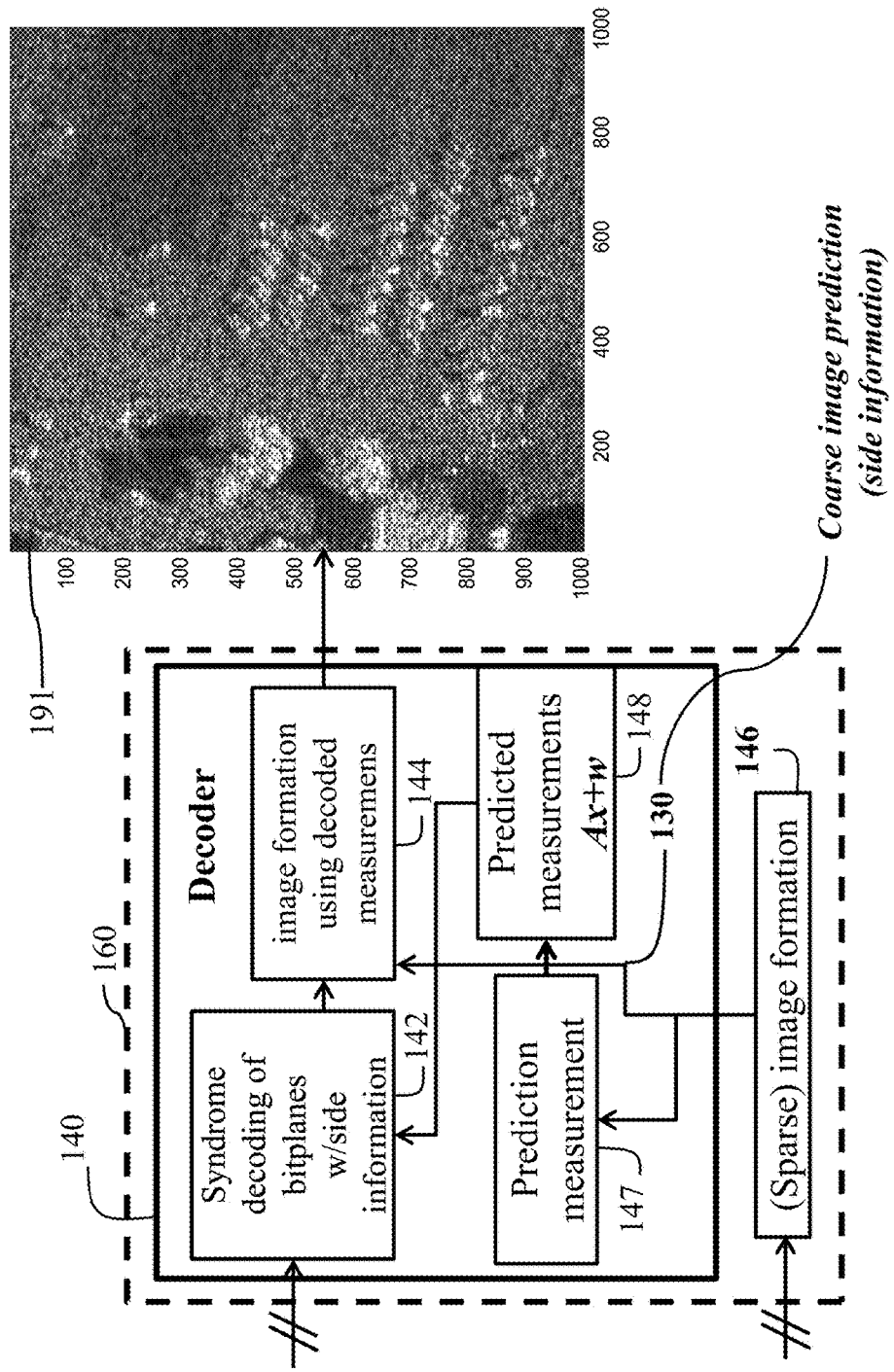

FIG. 1D and FIG. 1E are systems used to compress and decompress, respectively, data acquired using a synthetic aperture radar (SAR) system, using the method of FIG. 1B and FIG. 1A, respectively, according to embodiments of the present disclosure. FIG. 1D shows the encoder 120 that obtains the linear measurements Ax of the input signal 101, adds dither w as and quantizes them as Q(Ax+w) 122. The quantized dithered linear measurements are separated into bitplanes and each bitplane is encoded using a code and a syndrome of the appropriate rate is computed for each bitplane 124. The syndromes comprise the encoded quantized dithered linear measurements, which can be transmitted to the decoder 120. At least one aspect of FIG. 1D, among many aspects, is that it can be used to compress synthetic aperture radar (SAR) signals, or other radar or light radar (LIDAR) data. Such data are often used to recover images through a transformation, known as image formation, or image reconstruction.

Still referring to FIG. 1D and FIG. 1E, in this particular embodiment, the encoder 120 of FIG. 1D can also separately encode information necessary to produce and transmit the side information 130. To do so, the encoder 120 can perform non-uniform subsampling 135 or coarse quantization 136 or both. The side information y 130 of FIG. 1D can also be transmitted to the decoder 140 of FIG. 1E for image formation 146 of FIG. 1E, which produces a coarse image prediction 130 that serves as the side information 130. The decoder 140 of FIG. 1E measures the coarse image prediction using linear dithered measurements 147 to produce predicted linear dithered measurements Ax+w 148.

Referring to FIG. 1E, using the predicted linear dithered measurements as side information, the decoder 140 decodes 142 the syndromes of the bitplanes 124, comprising the encoded quantized linear dithered measurements, which recovers the quantized dithered linear measurements, i.e., the data required to perform image formation 144 and recover the image 191. Image formation 144 can also use the coarse image prediction 130 to enhance the reconstruction of the image 191 from the data.

Figure 2:
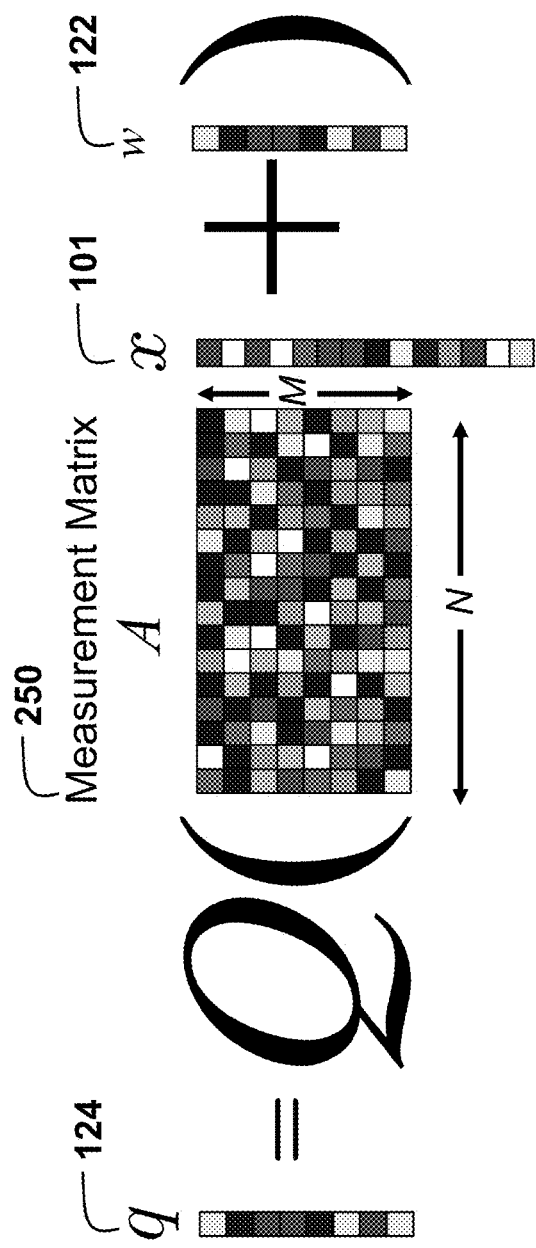
FIG. 2 is a schematic of an operation of an encoder using an encoding matrix according to embodiments of the present disclosure.

FIG. 2 is a schematic of an operation of an encoder using a measurement matrix according to embodiments of the present disclosure. FIG. 2 shows the encoding schematically, wherein the uncompressed signal x 101 has N dimensions, which can be real-valued or complex-valued. The present disclosure uses a measurement matrix A 250 with dimensions M×N to obtain M linear measurements Ax of the signal x. The matrix A may be real-valued or complex-valued. In some embodiments, real signals are measured using real-valued matrices, and complex-valued signals are measured using complex-valued matrices. However, in some embodiments the real-valued signal can be measured using a complex-valued matrix, and vice versa.

The matrix 250 can be generated in a number of ways. In some embodiments, the matrix 250 can be generated randomly. For example, entries in the matrix A can be a realization of random variables drawn from an i.i.d. uniform, Rademacher, Gaussian, or sub-Gaussian distribution. Alternatively, rows of the matrix A can be uniformly sampled from a unit sphere in N dimensions.

Still referring to FIG. 2, in another embodiment, the measurement matrix A can be a discrete Fourier transform (DFT) matrix, or a Hadamard transform matrix, or a discrete sine or cosine transform (DCT or DST) matrix, or any of the above matrices with columns permuted and some of their rows removed. In another embodiment, the matrix can be a low density parity check code (LDPC) matrix, or an expander graph matrix. The advantage of using structured matrices (DFT, DCT, DST, Hadamard) or sparse matrices (LDPC, expander graphs) is that these matrices require less memory and processing, thus reducing the complexity of the encoder.

Subsequently, a dither w 122 may be added to the linear measurements as Ax+w. In an embodiment the dither is randomly generated from a uniform distribution with support $\Delta$. The result is quantized using a B bit scalar quantizer. The quantizer may be a uniform quantizer with quantization parameter $\Delta$, or some other scalar quantizer commonly known in the art, such as $\mu$-law or logarithmic. Note that because this is a scalar quantizer and the input is a vector, the quantizer function is applied element-wise to each of the vector elements.

Figure 3A:
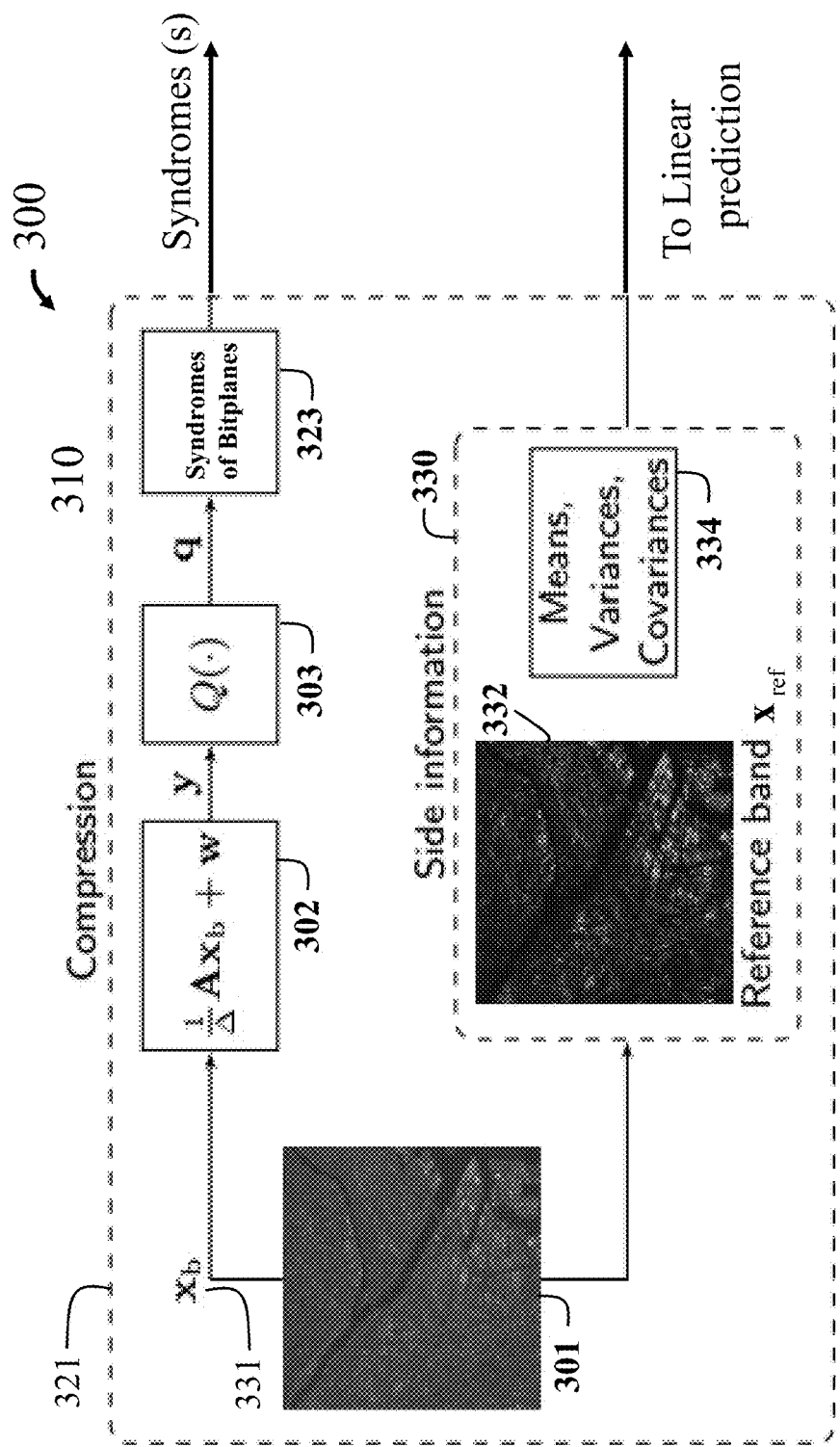
FIG. 3A and FIG. 3B are flow diagrams of a system to encode and decode, respectively, multispectral or hyperspectral images that compressively measures the band to be encoded, using a measurement matrix A, dither w, and uniformly quantizing the measurements, according to embodiments of the present disclosure.
Figure 3B:
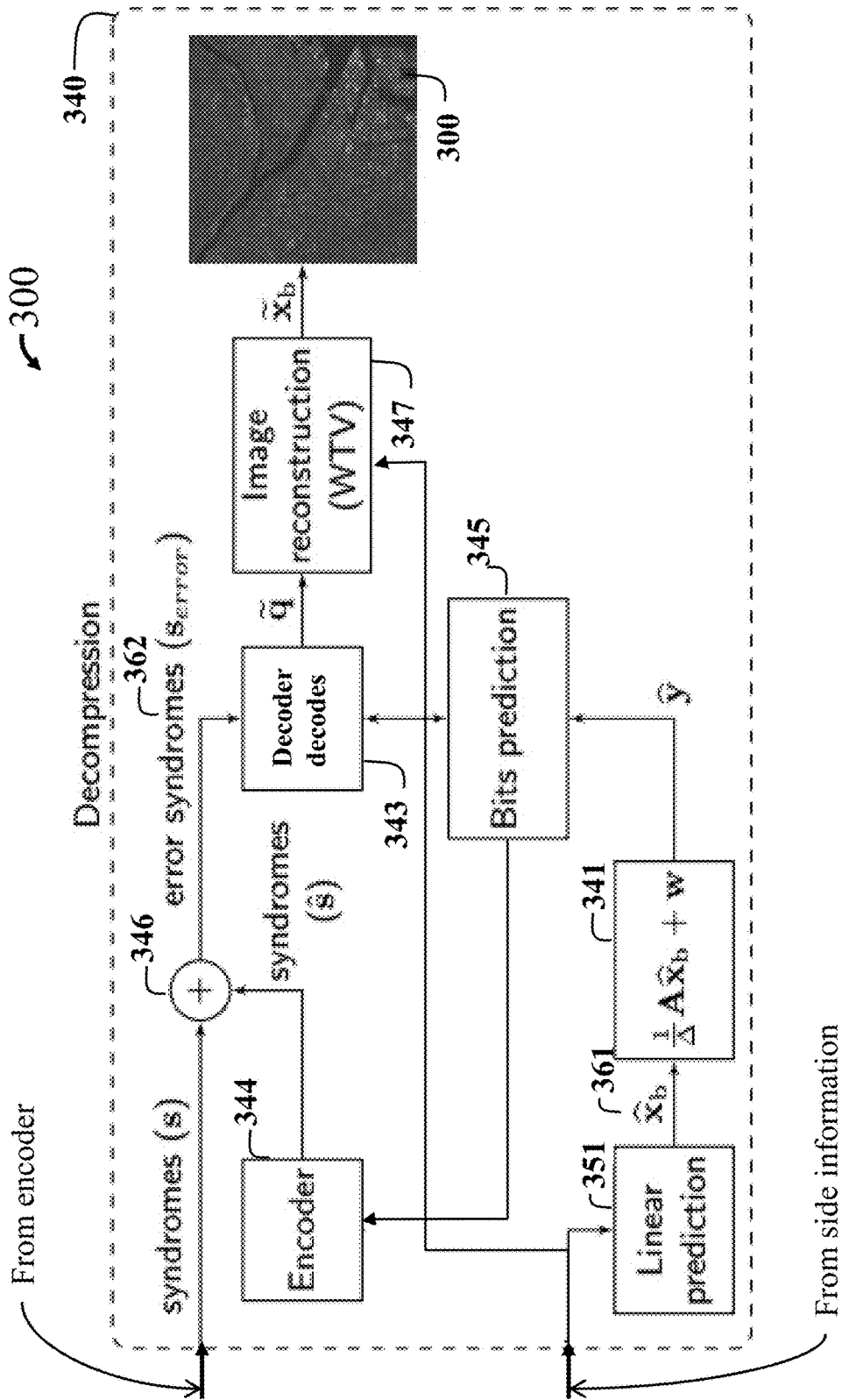

FIG. 3A and FIG. 3B are flow diagrams of a system to encode 321 and decode 340, respectively, multispectral or hyperspectral images, according to embodiments of the invention.

Referring to FIG. 3A, the image 301 comprises of several bands to be compressed and transmitted. One or more reference bands 332 are selected and transmitted as side information 330. Prediction statistics 334, i.e., means, variances, and covariances may also be computed and included in the side information 330. The encoder 321 compressively measures and dithers 301 the band of the image 301 to be encoded, henceforth denoted as $x_b \in R^n$ 331, using a scaled randomized measurement matrix $$\frac{1}{\Delta}A$$

and dither w. The dithered linear measurements are quantized 303 and the syndromes of the bitplanes are computed 323 according to embodiments of the present disclosure.

Still referring to FIG. 3A, having access to the corresponding block in the reference band, $x_{ref}$ 323, the encoder also computes prediction statistics to be transmitted. These will enable linear prediction of $x_b$ from $x_{ref}$ at the decoder. In particular, the following statistics may be computed and transmitted as part of the side information $$\mu_b = \frac{1}{n}\sum_{i=1}^{n}(x_b)_i, \quad (4)$$

$$\sigma_b^2 = \frac{1}{n}\sum_{i=1}^{n}((x_b)_i - \mu_b)^2, \quad (5)$$

$$\sigma_{ref,b} = \frac{1}{n}\sum_{i=1}^{n}((x_{ref})_i - \mu_{ref})((x_b)_i - \mu_b). \quad (6)$$

The overhead of this transmission is small. For example, assuming 8 bits per parameter, blocks of size 64×64, each band requires 3 parameters, totaling 24 bits, i.e., 0.0059 bits per pixel (bpp). Note that the mean and variance of the reference band may be computed at the decoder and may not need to be transmitted.

Further, in FIG. 3B we assume that the decoder 340 has access to the reference band 332 as side information 330, denoted as $x_{ref} \in R^n$, as well as sufficient prediction information, such as means variances and covariances of the reference band and the encoded band 334 to obtain a good prediction $\hat{x}_b \in R^n$ 361 of $x_b$ 331 using, for example, linear prediction 351. The side information may have been transmitted by the encoder 321 or otherwise available to the decoder.

Further, in FIG. 3A, in some embodiments, the reference band 332 may be coded. For example, a conventional lossy or lossless compression method might be used. We assume that such a reference band 332 is available at the decoder 340 for simple analysis. Furthermore, we assume that the decoder 340 has access to prediction information, such as means variances and covariances of the reference band and the encoded band 334 that help the prediction of the encoded band from the reference band 332. In FIG. 3A, we assume that the encoder 320, which has access to both bands 331 332, encodes 323 and transmits linear prediction coefficients 334, i.e., means, variances and covariances, to the decoder 340. However, in other embodiments, the decoder might have access to the side information by other means, e.g., by having access to a database of similar images obtained at different times.

Further, in FIG. 3A, the decoder 340 uses the prediction of the encoded band to make a prediction of the dithered linear measurements by obtaining dithered linear measurements of the prediction of the encoded band 341. The prediction of the dithered linear measurements of the encoded band is used to iterate between predicting each bitplane 341, assuming lower significance bitplanes have been decoded and corrected, and correcting the predicted bitplanes in the decoder 343 that decodes the syndrome using the predicted bitplane as side information. A common technique in the art to facilitate the decoding of the decoder 343 is to compute a syndrome from the side information using an encoder 344, adding this syndrome to the received syndrome 346, using binary arithmetic, to produce an error syndrome 362. The decoder, then, only needs to determine a correction to the bitplane such that if the correction is encoded, it has a syndrome equal to the error syndrome. However, in other embodiments, different decoding approaches can be used to correct the bitplanes using the syndromes.

Coding

In some embodiments, to manage complexity on-board a satellite, the image 301 may be segmented in blocks of smaller size, for example of size n=N×N. Each block can be treated separately as a smaller image, both at encoding and at decoding, enabling massive parallelization of both steps.

For each block, the band to be encoded, $x_b$, is measured, scaled, and dithered according to $$y = \frac{1}{\Delta}Ax_b + w, \quad (3)$$

where $y \in R^m$ are the measurements, $A \in R^{m \times n}$ is a measurement operator, $\Delta \in R$ a scaling parameter, and $w \in R^m$ is a dither vector with i.i.d. elements drawn uniformly in [0,1). Typically, although not necessarily, the operator A is compressive, i.e., it reduces the dimensionality at the output to m<n.

In some embodiments, the measurements may be quantized element-wise, using a scalar uniform integer quantizer Q(·). The quantizer rounds its input to the nearest integer, using B bits, producing quantized measurements q=Q(y) $\in Z^m$. We assume that the quantizer does not saturate, i.e., that B is selected sufficiently large. It should be noted that changing the scalar parameter $\Delta$ in (3) is equivalent to using unscaled measurements and setting the quantization interval to $\Delta$.

We use $q_{(k)}$, k=1, . . . , B to denote each bitplane of the measurement, from least significant to most significant. In other words, $q_{(k)} \in F_2^m$ is a binary vector containing the k th significant bit of all quantized measurements q, with k=1 being the Least Significant Bits (LSB) and k=B the MSB.

A key realization, formalized and quantified in Theorem 1, described below in the Coding Section, is that the quantized measurements of the encoded band can be predicted from the measurements of the image prediction. In particular, while the least significant bits of the measurements will be difficult to predict, as the significance of the bits increases, prediction becomes more reliable. Furthermore, if the first k least significant bit levels of the measurements are known or have been reliably decoded at the decoder, then the prediction of the $(k+1)^{th}$ least significant bit level becomes easier. In other words, we can encode each bitplane with a distributed source code at a rate appropriate for the reliability of the prediction. The decoder of FIG. 3B iteratively decodes each bitplane, from the least significant to the most significant, updating the prediction of the not-yet-decoded bitplanes as each bitplane is decoded.

One issue with commonly used distributed coding schemes is that it is difficult to decide what code rate to use. In particular, it is often not straightforward to quantify how prediction quality affects the encoding of the signal and the reliability of each bit of the encoding. Conveniently in our case, Theorem 1 described below, exactly quantifies the probability that the $(k+1)^{th}$ Least Significant Bits (LSB) will be different between prediction and true measurement as a function of the prediction error, and assuming that the first k LSBs have been correctly decoded. Thus, the rate required for successful decoding of the code can be exactly computed if the prediction quality is known.

In some embodiments, the linear prediction parameters also inform the encoder of the prediction error, which is equal to $$\epsilon^2 = \|x_b - \hat{x}_b\|^2 = n\sigma_\epsilon^2 = n\left(\sigma_b^2 - \frac{\sigma_{ref,b}^2}{\sigma_{ref}^2}\right), \quad (7)$$

where $\hat{x}_b$ is the prediction. For each bitplane k, the linear prediction error may quantify the probability that a measurement bit will be different when comparing the prediction to the correct measurements, according to the following theorem.

Theorem 1: Consider a signal $x_b$ measured using a random matrix A with i.i.d. $N(0,\sigma^2)$ entries according to (3). Also consider its prediction $\hat{X}_b$ with prediction error $\epsilon = \|X_b - \hat{X}_b\|$ and assume that bitplanes k=1, . . . , K−1 have been correctly decoded. Then $q_{(K)}$ can be estimated with probability of bit error equal to $$p_K = \frac{1}{2} - \sum_{l=1}^{+\infty} e^{-\frac{1}{2}\left(\frac{\pi \sigma \epsilon l}{2^{K-1}\Delta}\right)^2} \operatorname{sinc}\left(\frac{l}{2}\right)\operatorname{sinc}\left(\frac{l}{2^K}\right). \quad (8)$$

Furthermore, eq. (8) may be computed to an arbitrary precision, even when computation is scarce. Eq. (8) may also be approximated well as a piecewise linear function.

Figure 4:
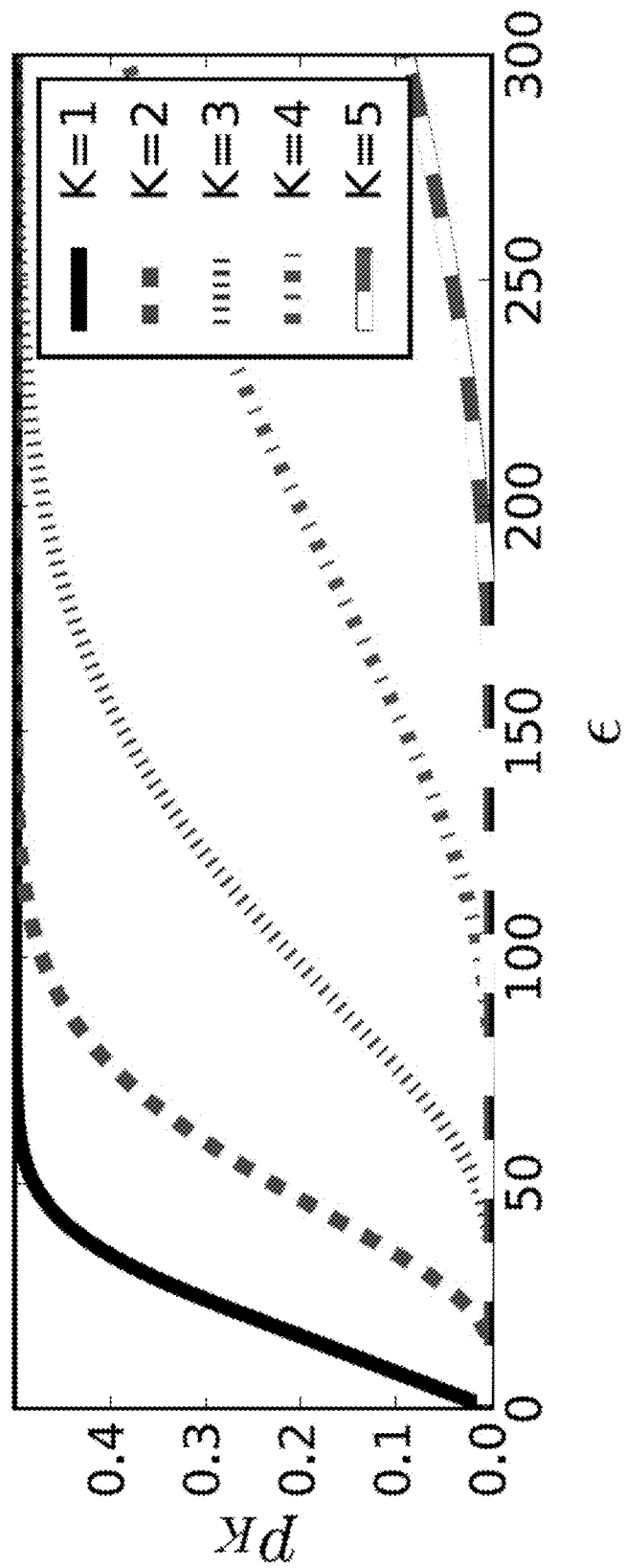
FIG. 4 illustrates how the probability of a bit error on the Kth bitplane behaves as a function of the prediction error, assuming K−1 correctly decoded bitplanes, different values of K, according to the present disclosure.

FIG. 4 illustrates how the probability behaves as a function of the prediction error, for different values of K−1 correctly decoded bitplanes, according Theorem 1 in the present disclosure. Further, FIG. 4 illustrates that the range of errors for which the bitplane prediction is accurate increases rapidly with K, making syndrome coding unnecessary for large K. Probability $p_K$ of bit error in decoding is plotted as a function of the prediction error, assuming K−1 bitplanes have been correctly decoded.

For each bitplane $q_{(k)}$, and given the prediction error (7), the encoder uses (8) to compute the probability $p_k$ that each bit will be flipped in the bitplane prediction. The bitplane must therefore be encoded via the appropriately chosen parity check matrix $H_{(k)}$ as the syndrome $s_k = H_{(k)} q_{(k)}$ of length $M_S > m H_B(p_k)$ bits, which is transmitted to the receiver.

Referring to FIG. 3A, when implementing the encoder, there are several practical considerations. In particular, a truly Gaussian measurement matrix A is not easy to implement in 302 because of storage and computation requirements, especially since the encoder is typically implemented in finite-precision arithmetic. In practice, in some embodiments we use a binary ±1 matrix, implemented by randomly permuting the signal, taking the Hadamard transform and randomly subsampling the output. Thus, we have a $O(n \log n)$ complexity operator, instead of $O(nm)$, which further requires only $O(n)$ storage, instead of $O(nm)$. In our experiments, the behavior of this ensemble is similar to the behavior of a Gaussian ensemble with respect to the probability of error in Theorem 1.

In addition, due to the complexity of computing codes of arbitrary rates on the fly for encoding the syndromes of bitplanes 323, in some embodiments we pre-compute and store codes for a fixed number of rates in the range r=0.05, 0.1, . . . , 0.95. Note that rate 1, i.e., $p_k=0$ means that there is no need to send any data since there is no decoding error. In contrast, for $p_k=0.5$ we need a rate 0 code, i.e., the syndrome will have the same length as the bits to be encoded. In that case, instead of computing a syndrome we may simply transmit the entire bitplane $q_{(k)}$ as is.

Another practical consideration is the effect of finite blocklength, which limits the rate of the code we use to be strictly below capacity. In practice, after computing the required rate for the code, instead of selecting the next lower rate code from the available rates, we may heuristically select a code rate at least, for example, 0.1 less. More sophisticated approaches may be used to select the rate. In our experiments, we found that their benefit is minor in terms of the compression rate achieved, while the implementation complexity of more sophisticated approaches is significant.

Decoding

Referring to FIG. 3B, using the side information and the reference band, the decoder first computes an estimate $\hat{x}_b$ using a simple Linear Minimum Mean Squared Error (LMSSE) estimator $$\hat{x}_b = \frac{\sigma_{b,ref}}{\sigma_{ref}^2}(x_{ref} - \mu_{ref}) + \mu_b. \quad (9)$$

The estimate is measured, scaled and dithered, as with the original data in (3), to produce predictions of the measurements ŷ. The measurement predictions will be used to decode the syndromes and to recover the quantized measurements q exactly.

Still referring to FIG. 3B, the quantized measurements are iteratively recovered starting with the least significant bitplane k=1. At iteration k, a new estimate of the quantized measurements q̂ is computed, incorporating all the new information from the previous iterations. From that estimate, the k th bitplane, $\hat{q}_{(k)}$, is extracted and corrected using the syndrome $s_k$ to recover the corrected bitplane $\tilde{q}_{(k)}$. If the syndrome has been properly designed at the correct rate, decoding is successful with high probability and $\tilde{q}_{(k)}=q_{(k)}$.

In particular, for k=1, the predicted measurements are quantized to q̂. Their least significant bitplane $\hat{q}_{(1)}$ is the prediction corrected using by the syndrome $s_1$. For k>1, assuming k−1 bitplanes have been successfully decoded, q̂ is estimated by selecting the uniform quantization interval consistent with the decoded k−1 bitplanes and closest to the prediction ŷ. Having correctly decoded the first k−1 bitplanes is equivalent to the signal being encoded with a (k−1)-bit universal quantizer.

Figure 5B:
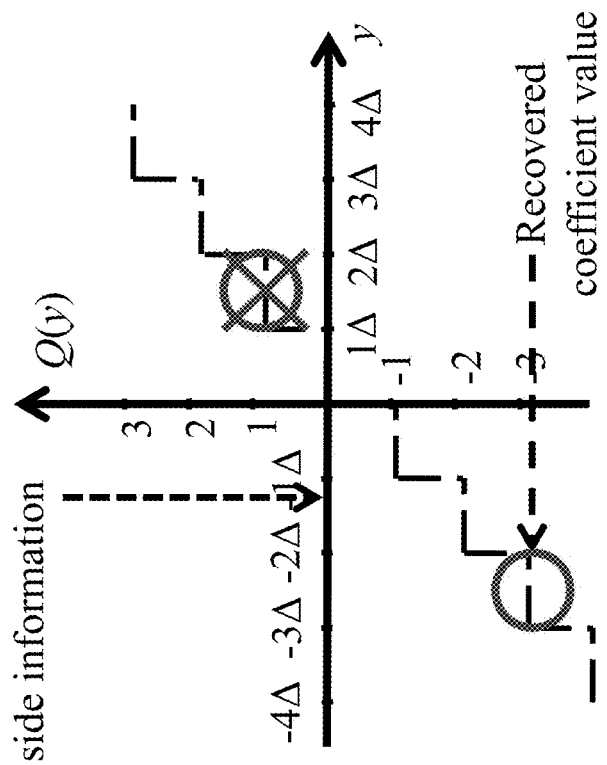
FIG. 5A and FIG. 5B are graphs illustrating a minimum distance decoding of a quantization point using the prediction measurement, according to embodiments of the present disclosure.
Figure 5A:
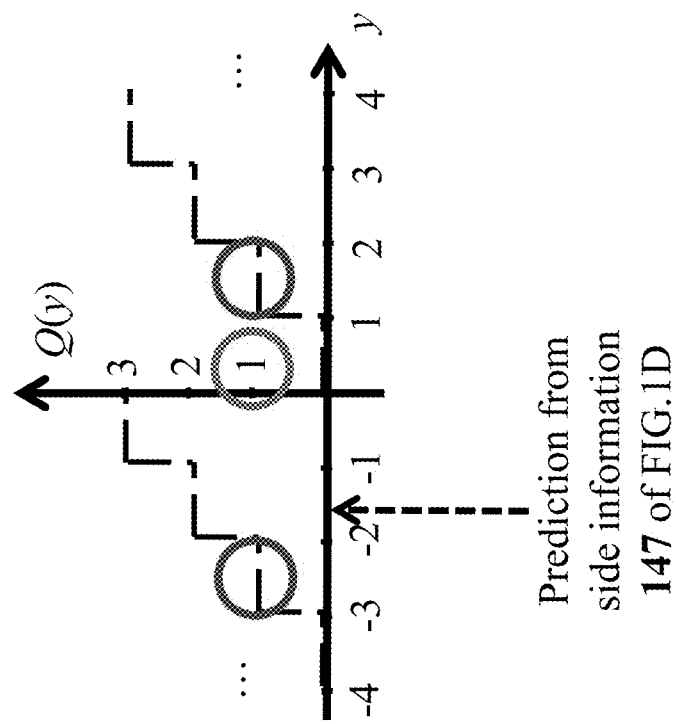

FIG. 5A and FIG. 5B are graphs illustrating a minimum distance decoding of a quantization point using the prediction measurement, according to embodiments of the present disclosure. An example of k−1=2 is shown in FIG. 5A. FIG. 5A plots a 2-bit universal quantizer, equivalent to a uniform scalar quantizer with all but the 2 least significant bits dropped.

FIG. 5B shows the corresponding 3-bit uniform quantizer used to produce q. In this example, the two least significant bits decode to the universal quantization value of 1, which could correspond to $q_i=1$ or −3 in the uniform quantizer. However, the prediction of the measurements $\hat{y}_i$ is closer to the interval corresponding to $q_i=-3$, and, therefore $\tilde{q}_i=-3$ is recovered.

Formally, let a temporary estimate of the yet undecoded bits be $\bar{q}=Q(\hat{y})_{(k:B)}$. Then the estimate for $q_i$ is $$\hat{q}_i = 2^k(\bar{q}_i + c) + (\tilde{q}_{1:k-1})_i, \quad (10)$$

where $c \in \{-1, 0, 1\}$ is chosen to minimize the distance of $\hat{q}_i$ to $\hat{y}_i$.

Finally, the k th bitplane $\hat{q}_{(k)}$ is corrected by decoding the syndrome to produce the corrected estimate $\tilde{q}_{(k)}$. As long as the syndrome satisfies the rate conditions of Theorem. 1, the decoding is reliable. Decoding continues iteratively until all B bitplanes have been decoded. After decoding each bitplane, the next bitplanes become increasingly reliable. At some point in the decoding process the remaining bitplanes are sufficiently reliable that q̂ will stop changing from iteration to iteration, and decoding can stop early. Note that this point is already known at the transmitter, because of Theorem. 1. At this point no additional syndromes are transmitted. In our experiments, with the parameters we used, typically 1 or 2 least significant bitplanes were transmitted as is, i.e., with a rate 0 syndrome code. A maximum of 3 additional bitplanes were transmitted for which syndromes were required, i.e., for which the rate was greater than 0 but less than 1.

Once all bitplanes have been successfully decoded, the quantized measurements q̃ are used to reconstruct the image by solving $$\hat{x}_b = \arg\min_x \|\tilde{q} - \frac{1}{\Delta}Ax - w\|_2^2 + \lambda WTV(x), \quad (11)$$

where λ=0.1 was tuned experimentally using a small part of the data. Several approaches exist to solve (11), wherein, for example, we could use a fast iterative shrinkage thresholding algorithm (FISTA)-based approach. Alternatively, any sparse recovery approach may be used, such as the ones described in the "compressive sensing and quantization" section above.

In some embodiments, the quadratic penalty in equation (11) might be replaced by other penalties or mixtures thereof. For example, a consistency penalty might be used, as known in the art, wherein the deviation of $$\frac{1}{\Delta}Ax + w$$

from q̃ is only penalized if it exceeds ½, i.e., the deviation uncertainty introduced by the quantizer. Approximations of the consistency penalty also include $l_p, p>2$ penalties. Alternatively, the penalty might be replaced by an $l_1$ penalty that is robust to outliers that might be introduced due to decoding errors. Combinations of penalties are also known in the art and may be used in embodiments of this invention.

In order to improve performance, in some embodiments, the optimization in (11) may be guided by the reference image since the two images exhibit the same structure. Specifically, the two spectral bands image the same area and, therefore, we expect edges to be colocated. Thus, the gradient in the reference image $X^{ref}$ can be used to set the weights in a weighted total variation (WTV) reconstruction, as noted above. In particular, given $X^{ref}$, we may set the weights in (1) as $$W_{s,t}^x = \begin{cases} 0.2, & \text{if } |X_{s,t}^{ref} - X_{s-1,t}^{ref}| > t, \\ 1, & \text{otherwise,} \end{cases} \quad (12)$$

$$W_{s,t}^y = \begin{cases} 0.2, & \text{if } |X_{s,t}^{ref} - X_{s,t-1}^{ref}| > t, \\ 1, & \text{otherwise,} \end{cases} \quad (13)$$

where t is an appropriate threshold chosen to qualify which gradients are considered significant. This choice of weights is common in a number of weighted sparsity measures.

In other embodiments, sparsity in some basis might be used instead of the weighted total variation (WTV). In such embodiments, the optimization may use the standard $l_1$ sparsity measure, which may also be weighted by the sparsity pattern of the reference band.

Figure 6A:
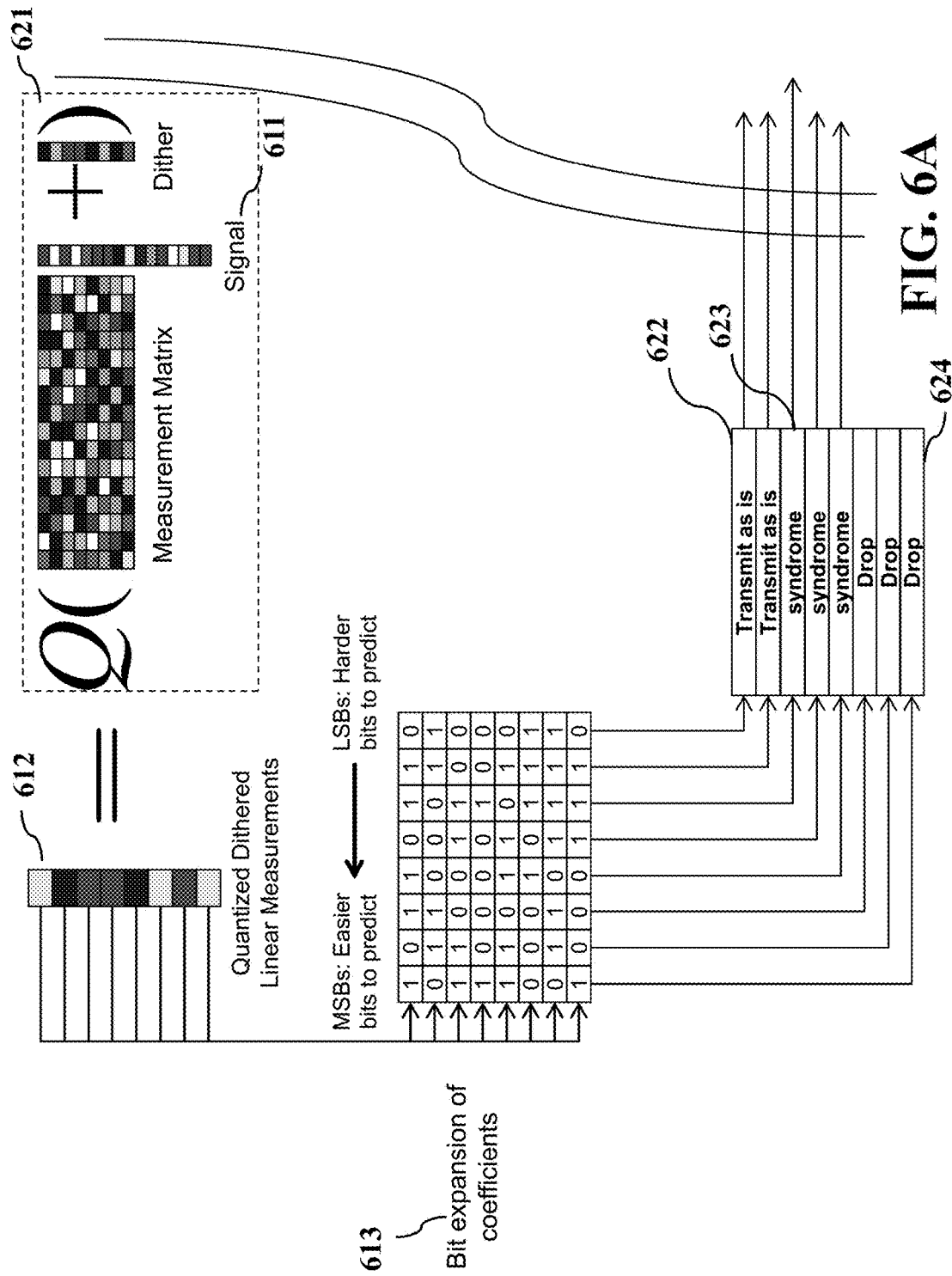
FIG. 6A is a schematic of an operation of an encoder using an measurement matrix according to embodiments of the present disclosure.

FIG. 6A is a schematic of an operation of an encoder using an encoding matrix and dither according to embodiments of the present disclosure. The signal 611 is measured and quantized 621 to produce quantized dithered linear measurements 612. The quantized dithered linear measurements can be represented in a bit expansion 613 from the least significant bitplanes (LBSs) to the most significant bitplanes (MSBs), the former being harder to accurately predict than the latter. For each of the bitplane, the encoder determines the rate required to encode the syndrome 623. In some embodiments, if the rate is similar to the size of the bitplane, the encoder might opt to transmit the bitplane as is 622. This is more common in the first few least significant bitplanes. In some embodiments, if the determined rate is close to zero, the encoder might opt to drop the bitplane and not transmit it 624

Figure 6B:
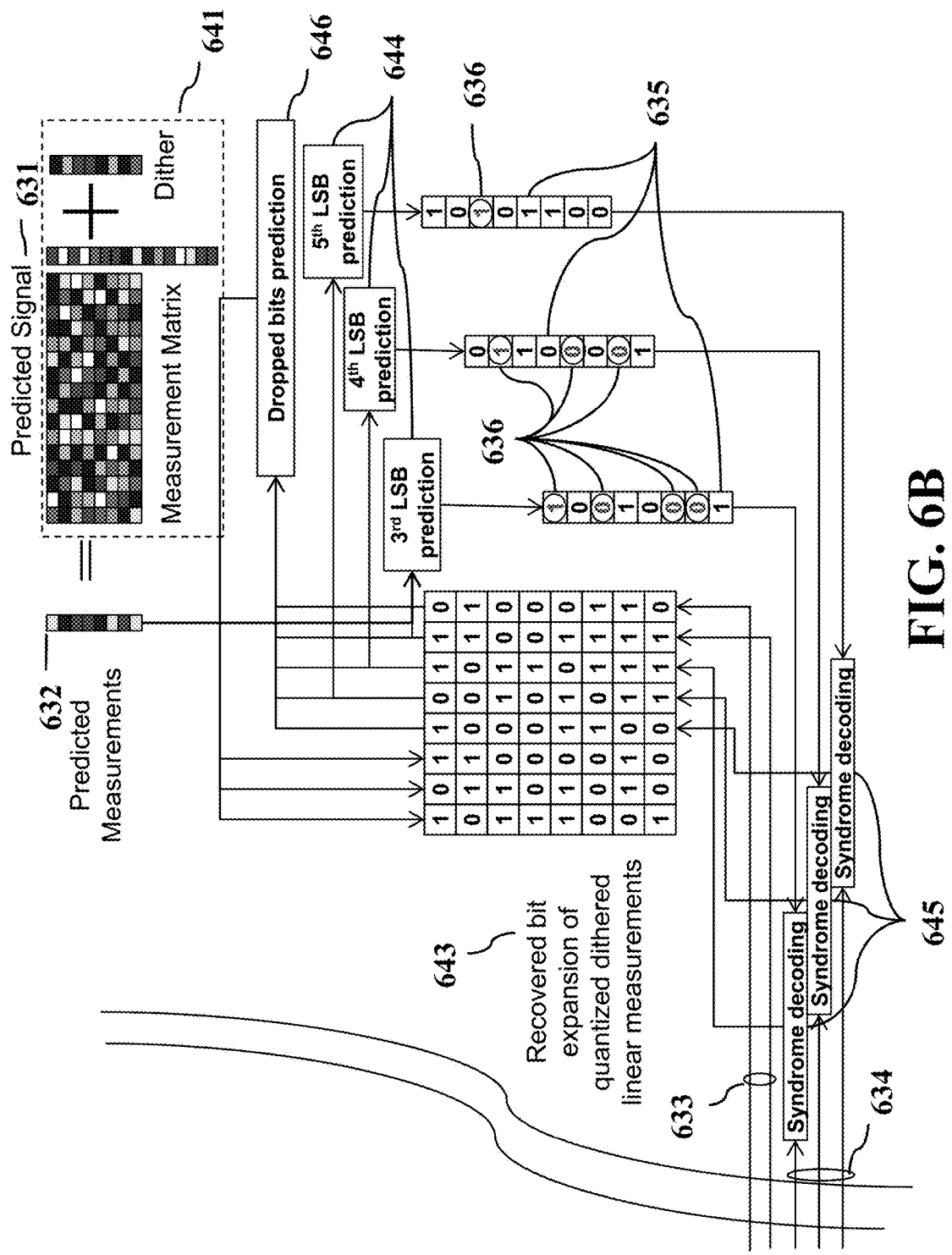
FIG. 6B is a schematic of an operation of a decoder using an measurement matrix according to embodiments of the present disclosure.

FIG. 6B is a schematic of an operation of a decoder using an encoding matrix and dither according to embodiments of the present disclosure. The encoder measures and dithers 641 the signal prediction 631 to compute predicted dithered linear measurements 632. Starting with the least significant bitplane and iteratively proceeding to the most significant bitplane, the decoder first uses the predicted dithered linear measurements to predict the bitplane assuming the previous bitplanes have been correctly recovered, and then uses the syndrome to correct the predicted bitplane to eventually obtain a recovered bit expansion of the quantized dithered linear measurements 643. If the instead of the syndrome, the bitplane has been transmitted as is 633, then there is no need for prediction and correction of the bitplane. The received bitplane is just used at the correct position. For the bitplanes for which syndromes have been received 634, a prediction of the biplane 635 is computed 644, as described in FIGS. 5A and 5B and in this disclosure, which contains some errors 636. The prediction is used as side information in decoding the syndrome 645, to correct the errors, recover the correct bitplane and produce the recovered bit expansion of the quantized dithered linear measurements 643. For the bitplanes which were dropped by the encoder, i.e., for which no syndrome is present, a final step uses all the previously corrected bitplanes to predict the dropped bits 646. This prediction is considered accurate and does not need to be corrected.

Figure 7:
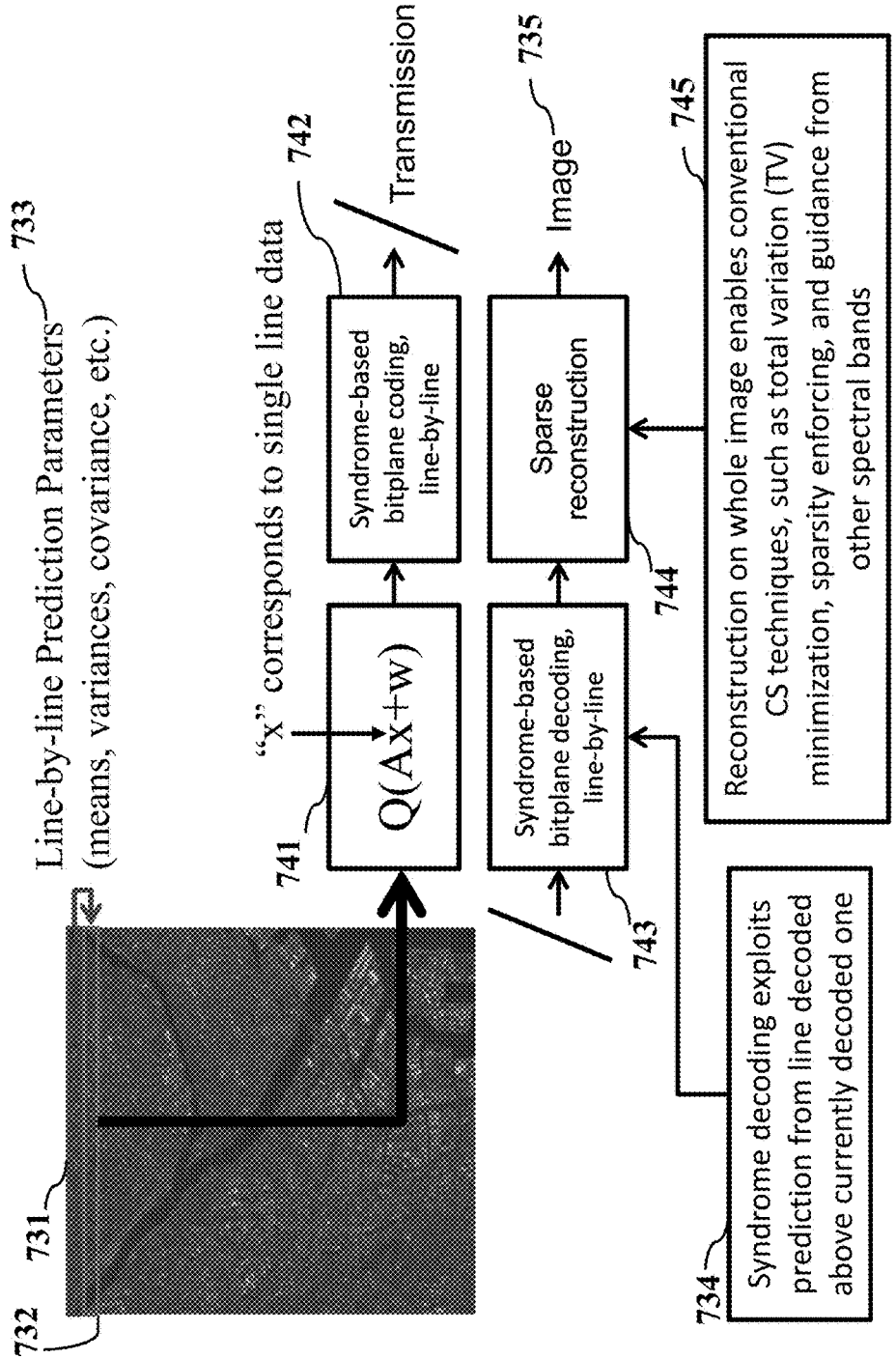
FIG. 7 is a flow diagram for encoding and decoding a single image according to embodiments of the present disclosure.

FIG. 7 is a flow diagram according to embodiments of the present disclosure of a system to encode a single image using line-by-line prediction of the measurements instead of using a separate band for prediction. In this embodiment, linear measurements of each line of the image 732 are encoded assuming the quantized dithered linear measurements of the previous line 731 have been correctly decoded. The line is measured, dithered and quantized 741, and syndromes of the bitplanes of the quantized dithered linear measurements are computed and transmitted 742, as necessary and as described in this disclosure. The parameters necessary to predict a line or its measurements from the previous lines, already decoded, are also computed 733 and assumed available at the decoder. The decoder iteratively decodes the syndromes for each bitplane of the quantized dithered linear measurements, as described above, using a prediction of the measurements determined by the previously decoded line 734. The decoded quantized linear measurements are then used with a sparse reconstruction method 744 to produce the decompressed image 735. In some embodiments, the decoder might accumulate multiple lines of decoded measurements 745, as well as other side information, before reconstructing the whole of part of the image. In other embodiments, the encoding might be performed by grouping several lines together instead of a single line-by-line encoding.

The advantage of a line-by-line encoder is that significantly lower memory is required to store a few lines of the image, than is required for a whole-image or a block-based encoding/decoding approach. This allows for further reducing the complexity of the encoder.

Figure 8:
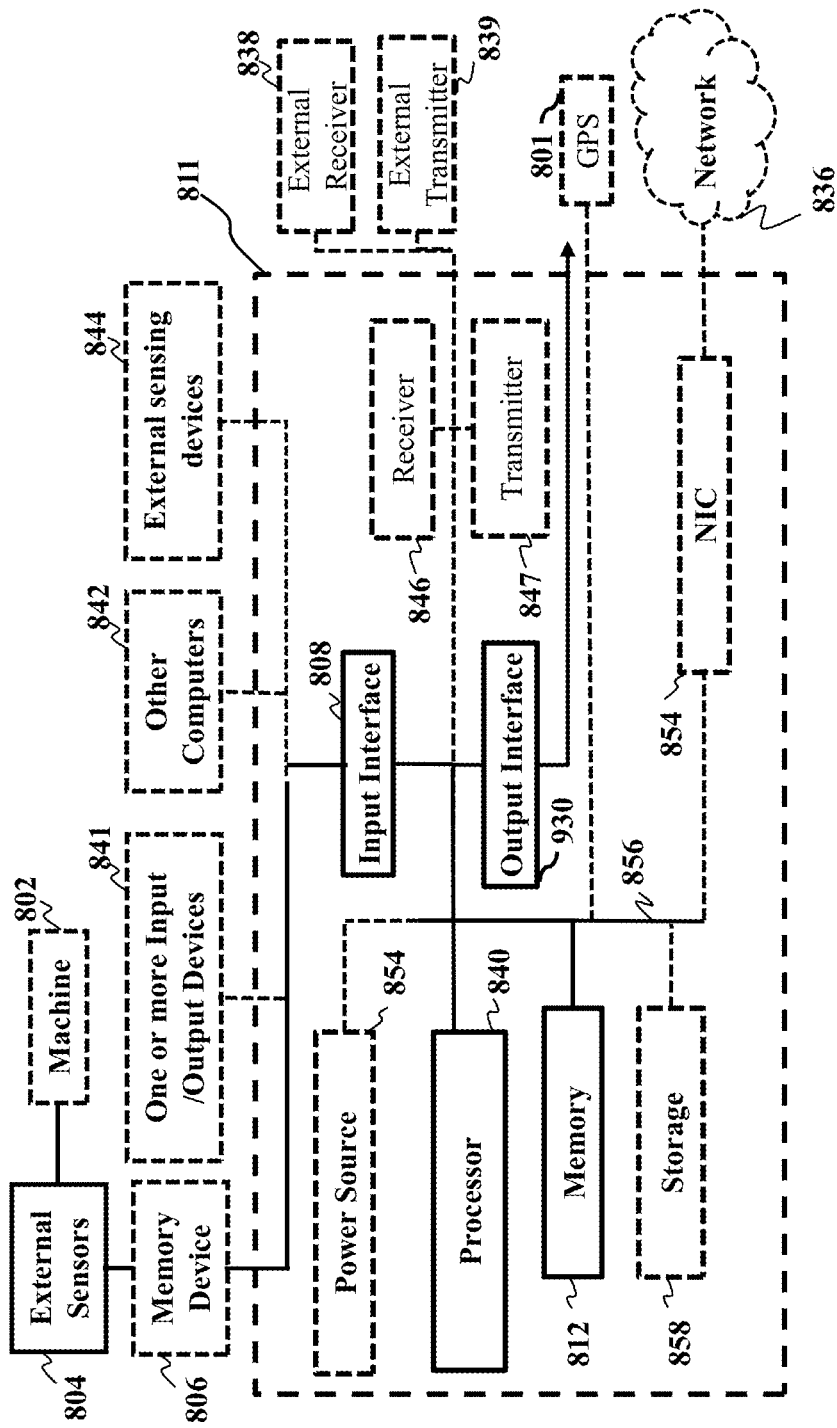
FIG. 8 is a block diagram of illustrating an alternate computer or processor of an encoder for the method of FIG. 1B, according to embodiments of the present disclosure.

FIG. 8 is a block diagram of illustrating an alternate computer or processor of an encoder for the method of FIG. 1A, according to embodiments of the present disclosure. The encoder 811 includes a processor 840, computer readable memory 812, storage 858 and user interface 849 with display 852 and keyboard 851, which are connected through bus 856. For example, the user interface 849 in communication with the processor 840 and the computer readable memory 812, acquires and stores the data in the computer readable memory 812 upon receiving an input from a surface, keyboard surface, of the user interface 857 by a user.

Contemplated is that the memory 812 can store instructions that are executable by the processor, historical data, and any data to that can be utilized by the methods and systems of the present disclosure. The processor 840 can be a single core processor, a multi-core processor, a computing cluster, or any number of other configurations. The processor 840 can be connected through a bus 856 to one or more input and output devices. The memory 812 can include random access memory (RAM), read only memory (ROM), flash memory, or any other suitable memory systems.

Still referring to FIG. 8, a storage device 858 can be adapted to store supplementary data and/or software modules used by the processor. For example, the storage device 858 can store historical data and other related data as mentioned above regarding the present disclosure. Additionally, or alternatively, the storage device 858 can store historical data similar to data as mentioned above regarding the present disclosure. The storage device 858 can include a hard drive, an optical drive, a thumb-drive, an array of drives, or any combinations thereof.

The system can be linked through the bus 856 optionally to a display interface (not shown) adapted to connect the system to a display device (not shown), wherein the display device can include a computer monitor, camera, television, projector, or mobile device, among others.

The encoder 811 can include a power source 854, depending upon the application the power source 854 may be optionally located outside of the encoder 811.

Still referring to FIG. 8, the data or other data, among other things, can be transmitted over a communication channel of the network 836, and/or stored within the storage system 858 for storage and/or further processing. Further, the data or other data may be received wirelessly or hard wired from a receiver 846 (or external receiver 838) or transmitted via a transmitter 847 (or external transmitter 839) wirelessly or hard wired, the receiver 846 and transmitter 847 are both connected through the bus 856. Further, a GPS 801 may be connected via bus 856 to the encoder 811. The encoder 811 may be connected via an input interface 808 to external sensing devices 844 and external input/output devices 841. The encoder 811 may be connected to other external computers 842. An output interface 809 may be used to output the processed data from the processor 840.

Figure 9:
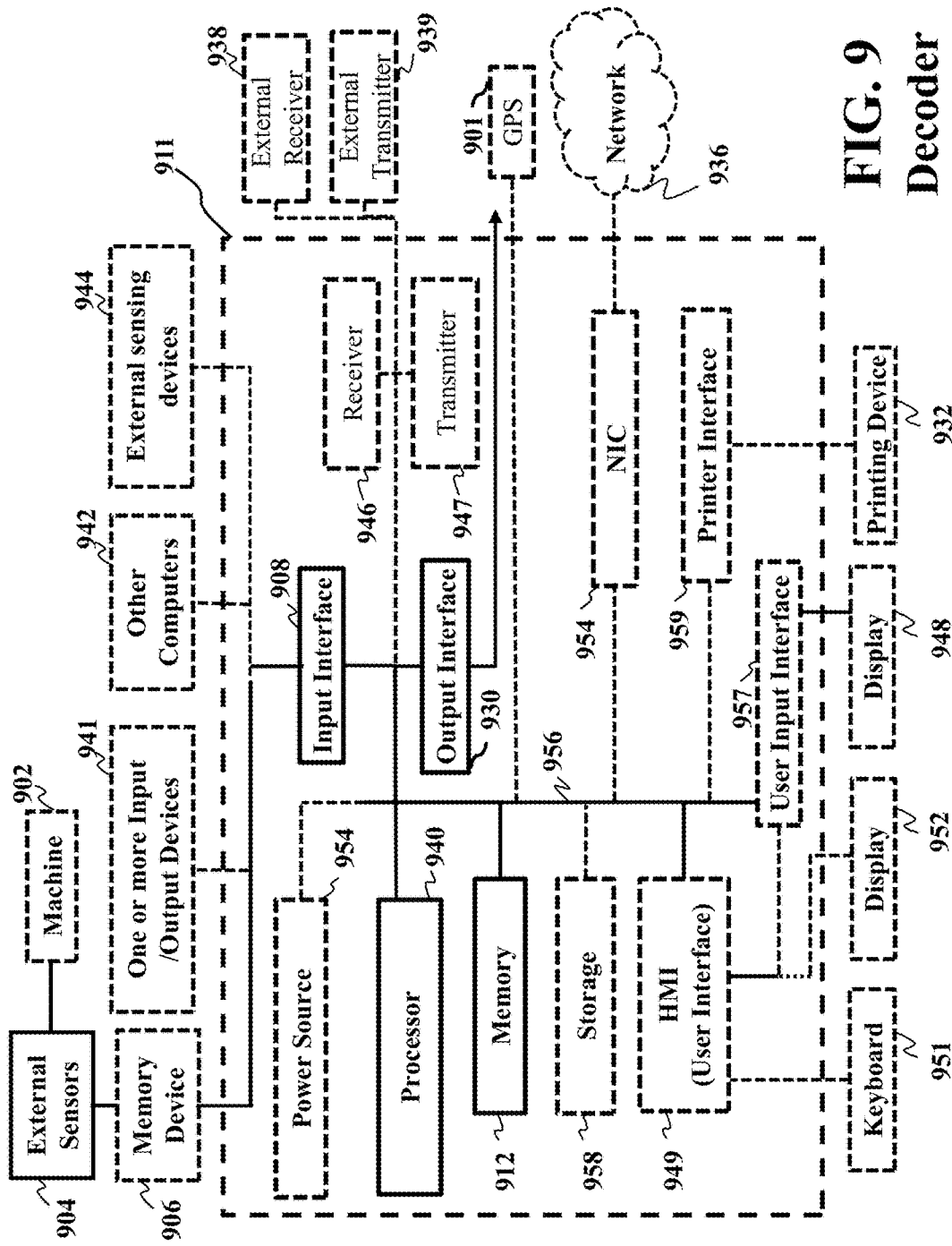
FIG. 9 is a block diagram of illustrating an alternate computer or processor of a decoder for the method of FIG. 1A, according to embodiments of the present disclosure.

FIG. 9 is a block diagram of illustrating an alternate computer or processor of an decoder for the method of FIG. 1A, according to embodiments of the present disclosure. The decoder 911 includes a processor 940, computer readable memory 912, storage 958 and user interface 949 with display 952 and keyboard 951, which are connected through bus 956. For example, the user interface 949 in communication with the processor 940 and the computer readable memory 912, acquires and stores the data in the computer readable memory 912 upon receiving an input from a surface, keyboard surface, of the user interface 957 by a user.

Contemplated is that the memory 912 can store instructions that are executable by the processor, historical data, and any data to that can be utilized by the methods and systems of the present disclosure. The processor 940 can be a single core processor, a multi-core processor, a computing cluster, or any number of other configurations. The processor 940 can be connected through a bus 956 to one or more input and output devices. The memory 912 can include random access memory (RAM), read only memory (ROM), flash memory, or any other suitable memory systems.

Still referring to FIG. 9, a storage device 958 can be adapted to store supplementary data and/or software modules used by the processor. For example, the storage device 958 can store historical data and other related data as mentioned above regarding the present disclosure. Additionally, or alternatively, the storage device 958 can store historical data similar to data as mentioned above regarding the present disclosure. The storage device 958 can include a hard drive, an optical drive, a thumb-drive, an array of drives, or any combinations thereof.

The system can be linked through the bus 956 optionally to a display interface (not shown) adapted to connect the system to a display device (not shown), wherein the display device can include a computer monitor, camera, television, projector, or mobile device, among others.

The decoder 911 can include a power source 954, depending upon the application the power source 954 may be optionally located outside of the decoder 1011. Linked through bus 956 can be a user input interface 957 adapted to connect to a display device 948, wherein the display device 948 can include a computer monitor, camera, television, projector, or mobile device, among others. A printer interface 959 can also be connected through bus 956 and adapted to connect to a printing device 932, wherein the printing device 932 can include a liquid inkjet printer, solid ink printer, large-scale commercial printer, thermal printer, UV printer, or dye-sublimation printer, among others. A network interface controller (NIC) 934 is adapted to connect through the bus 956 to a network 936, wherein data or other data, among other things, can be rendered on a third party display device, third party imaging device, and/or third party printing device outside of the decoder 911.

Still referring to FIG. 9, the data or other data, among other things, can be transmitted over a communication channel of the network 936, and/or stored within the storage system 958 for storage and/or further processing. Further, the data or other data may be received wirelessly or hard wired from a receiver 946 (or external receiver 938) or transmitted via a transmitter 947 (or external transmitter 939) wirelessly or hard wired, the receiver 946 and transmitter 947 are both connected through the bus 956. Further, a GPS 901 may be connected via bus 956 to the decoder 911. The decoder 911 may be connected via an input interface 908 to external sensing devices 944 and external input/output devices 941. The decoder 911 may be connected to other external computers 942. An output interface 909 may be used to output the processed data from the processor 940.

The above-described embodiments of the present disclosure can be implemented in any of numerous ways. For example, the embodiments may be implemented using hardware, software or a combination thereof. Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

What is claimed is:

1. A method for reconstructing a signal, wherein the signal is uncompressed, comprising steps of:

obtaining an encoded signal corresponding to the signal, wherein the encoded signal includes encoded quantized dithered linear measurements of the signal, wherein the encoded quantized dithered linear measurements of the signal correspond to quantized dithered linear measurements of the signal, such that the quantized dithered linear measurements are separated into bitplanes, and each bitplane is encoded with a code at a predetermined rate that ensures a reliable correction of a prediction of the quantized dithered linear measurements of the signal;

obtaining side information about the signal;

using the side information to obtain a prediction of the dithered linear measurements of the signal;

using the prediction of the dithered linear measurements of the signal and the encoded quantized dithered linear measurements to obtain the quantized linear measurements of the signal based on processing each bitplane iteratively, starting from a least significant level bitplane to a most significant level bitplane, such that at each iteration, a prediction of each bitplane is formed using the prediction of the dithered linear measurements of the signal and the bitplanes processed in the previous iterations, wherein each code for each bitplane is used to correct each bitplane prediction, so as to recover the quantized dithered linear measurements; and reconstructing the signal as a reconstructed signal using the recovered quantized dithered linear measurements, wherein the steps are performed in a processor of a decoder.

2. The method of claim 1, wherein the side information is encoded as encoded side information, and further comprising:

decoding the encoded side information to obtain decoded side information.

3. The method of claim 1, wherein the prediction of the signal is obtained from the side information using linear prediction.

4. The method of claim 1, further comprising:

updating the prediction of the signal and the side information using the reconstructed signal; and repeating the determining, the combining, and the reconstructing steps using the updated prediction and side information.

5. The method of claim 1, wherein the side information includes a signal similar to the encoded signal.

6. The method of claim 1, wherein the side information includes statistical similarity measures of the encoded signal with a signal similar to the encoded signal.

7. The method of claim 6, wherein the statistical similarity measures includes a mean, a covariance, and a correlation of the signal.

8. The method of claim 1, wherein the side information includes quantized measurements of the signal.

9. The method of claim 1, wherein the signal is acquired by a remote sensing system.

10. The method of claim 9, wherein the remote sensing system is mounted on a satellite system.

11. The method of claim 9, wherein the remote sensing system is a radar system.

12. The method of claim 9, wherein the remote sensing system is a Synthetic Aperture Radar (SAR) system.

13. The method of claim 1, wherein the code is a distributed source code.

14. The method of claim 13, wherein the distributed source code is a low-density parity check code (LDPC).

15. The method of claim 13, wherein the distributed source code is a polar code.

16. The method of claim 13, wherein the distributed source code is a fountain code.

17. The method of claim 1, wherein the signal includes a multispectal image or a hyperspectral image.

18. The method of claim 1, wherein the obtained side information includes statistical data for the prediction of spectral bands of the signal.

19. The method of claim 1 wherein the reconstructing solves an optimization problem.

20. The method of claim 19, wherein the optimization enforces a sparsity model.

21. The method of claim 19, wherein the optimization enforces low signal total variation.

22. The method of claim 19, wherein the optimization uses weights derived from the side information.

23. The method of claim 19 wherein the optimization uses weights derived from the signal prediction, the side information, or both.

24. The method of claim 19, wherein the optimization is performed using a greedy algorithm.

25. The method of claim 19, wherein the optimization is performed using a convex relaxation.

26. The method of claim 19, wherein the optimization is using a dictionary.

27. The method of claim 26, wherein the dictionary is learned from the prediction.

28. The method of claim 26, wherein the dictionary is learned from a reconstructed signal.

29. The method of claim 26, wherein the decoder accesses the side information via a database of similar images obtained at different times, such that the database is stored in a memory in communication with the processor of the decoder.

30. The method of claim 1, wherein the predetermined rate is determined as a function of the predictive quallity of the side information.

31. The method of claim 30, wherein the predictive quality of the side information is measured using the prediction error.

32. A non-transitory computer readable storage medium embodied thereon a program executable by a computer for performing a method, the method is for reconstructing a signal, wherein the signal is uncompressed, comprising steps of:
obtaining an encoded signal corresponding to the signal, wherein the encoded signal includes encoded quantized dithered linear measurements of the signal, wherein the encoded quantized dithered linear measurements of the signal correspond to quantized dithered linear measurements of the signal, such that the quantized dithered linear measurements are separated into bitplanes, and each bitplane is encoded with a code at a predetermined rate that ensures a reliable correction of a prediction of the quantized dithered linear measurements of the signal;
obtaining side information about the signal;
using the side information to obtain a prediction of the dithered linear measurements of the signal;
using the prediction of the dithered linear measurements of the signal and the encoded quantized dithered linear measurements to obtain the quantized linear measurements of the signal based on processing each bitplane iteratively, starting from a least significant level bitplane to a most significant level bitplane, such that at each iteration, a prediction of each bitplane is formed using the prediction of the dithered linear measurements of the signal and the bitplanes processed in the previous iterations, wherein each code for each bitplane is used to correct each bitplane prediction, so as to recover the quantized dithered linear measurements; and
reconstructing the signal as a reconstructed signal using the recovered quantized dithered linear measurements, wherein the steps are performed in a decoder.

33. A decoder for reconstructing a signal, wherein the signal is uncompressed, comprising:
a receiver to receive from an encoder an encoded signal corresponding to the signal, wherein the encoded signal includes encoded quantized dithered linear measurements of the signal, such that the encoded quantized dithered linear measurements of the signal correspond to quantized dithered linear measurements of the signal, wherein the quantized dithered linear measurements are separated into bitplanes, and each bitplane is encoded with a code at a predetermined rate that ensures a reliable correction of a prediction of the quantized dithered linear measurements of the signal;
a processor is configured to obtain side information about the signal,
use the side information to obtain a prediction of the dithered linear measurements of the signal, and uses the prediction of the dithered linear measurements of the signal and the encoded quantized dithered linear measurements to obtain the quantized linear measurements of the signal based on processing each bitplane iteratively, starting from a least significant level bitplane to a most significant level bitplane, such that at each iteration, a prediction of each bitplane is formed using the prediction of the dithered linear measurements of the signal and the bitplanes processed in the previous iterations, wherein each code for each bitplane is used to correct each bitplane prediction, so as to recover the quantized dithered linear measurements; and
reconstruct the signal as a reconstructed signal using the recovered quantized dithered linear measurements, and stores the reconstructed signal in a memory in communication with the processor.

34. An encoder for encoding a signal, comprising:
a receiver to receive the signal;
a processor in communication with the receiver is configured to:
obtain quantized dithered linear measurements of the signal;
separate the quantized dithered linear measurements into bitplanes;
encode each bitplane with a code at a predetermined rate that ensures a reliable correction of a prediction of the bitplane of the quantized dithered linear measurements of the signal; and
a transmitter to transmit to a decoder the encoded signal corresponding to the signal;

a receiver of the decoder to receive from the encoder the encoded signal corresponding to the signal, wherein the encoded signal includes encoded quantized dithered linear measurements of the signal, such that the encoded quantized dithered linear measurements of the signal correspond to quantized dithered linear measurements of the signal, wherein the quantized dithered linear measurements are separated into bitplanes, and each bitplane is encoded with a code at a predetermined rate that ensures a reliable correction of a prediction of the quantized dithered linear measurements of the signal;

a processor of the decoder in communication with the receiver of the decoder obtains side information about the signal, and using the side information obtains a prediction of the dithered linear measurements of the signal, the decoder processor is configured to:

obtain the quantized linear measurements of the signal, using the prediction of the dithered linear measurements of the signal and the encoded quantized dithered linear measurements, based on processing each bitplane iteratively, starting from a least significant level bitplane to a most significant level bitplane, such that at each iteration, a prediction of each bitplane is formed using the prediction of the dithered linear measurements of the signal and the bitplanes processed in the previous iterations, wherein each code for each bitplane is used to correct each bitplane prediction, so as to recover the quantized dithered linear measurements; and reconstruct the signal as a reconstructed signal using the recovered quantized dithered linear measurements.

\* \* \* \* \*